US012088061B2

United States Patent
Tabata et al.

(10) Patent No.: US 12,088,061 B2
(45) Date of Patent: Sep. 10, 2024

(54) LIGHT SOURCE DEVICE, DRIVE METHOD, AND SENSING MODULE

(71) Applicant: SONY SEMICONDUCTOR SOLUTIONS CORPORATION, Kanagawa (JP)

(72) Inventors: Mitsushi Tabata, Kanagawa (JP); Takashi Masuda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 820 days.

(21) Appl. No.: 17/250,467

(22) PCT Filed: Jun. 14, 2019

(86) PCT No.: PCT/JP2019/023648
§ 371 (c)(1),
(2) Date: Jan. 25, 2021

(87) PCT Pub. No.: WO2020/026608
PCT Pub. Date: Feb. 6, 2020

(65) Prior Publication Data
US 2021/0313777 A1 Oct. 7, 2021

(30) Foreign Application Priority Data
Aug. 1, 2018 (JP) ................. 2018-144923

(51) Int. Cl.
*H01S 5/00* (2006.01)
*H01S 5/026* (2006.01)
(Continued)

(52) U.S. Cl.
CPC ........ *H01S 5/06804* (2013.01); *H01S 5/0261* (2013.01); *H01S 5/0428* (2013.01); *H01S 5/423* (2013.01)

(58) Field of Classification Search
CPC ............. H01S 5/06804; H01S 5/0261; H01S 5/0428; H01S 5/423; H01S 5/04256; H01S 5/06216
See application file for complete search history.

(56) References Cited

U.S. PATENT DOCUMENTS 5,572,540 A * 11/1996 Cheng ................... H01S 5/0262
372/38.07
2007/0286609 A1* 12/2007 Ikram .................. H04B 10/564
398/197

(Continued)

FOREIGN PATENT DOCUMENTS

CN 101466179 A 6/2009
CN 102090150 A 6/2011
(Continued)

OTHER PUBLICATIONS

International Search Report and Written Opinion of PCT Application No. PCT/JP2019/023648, issued on Jul. 23, 2019, 08 pages of ISRWO.

*Primary Examiner* — Kinam Park
(74) *Attorney, Agent, or Firm* — CHIP LAW GROUP

(57) ABSTRACT

A light source device including a light emitting unit in which multiple light emitting elements including vertical cavity surface emitting lasers are arranged is intended to curb temperature rise. A light source device according to the present technology includes a light emitting unit in which multiple light emitting elements including vertical cavity surface emitting lasers are arranged, and a driving unit that, regarding the light emitting element in the light emitting unit, causes multiple light emitting elements to be caused to emit light in a light emission target period to emit light in a time-divided manner in the light emission target period. By (Continued)

adopting time-division light emission, the number of light emitting elements that are caused to emit light simultaneously is reduced.

13 Claims, 16 Drawing Sheets

(51) Int. Cl.
*H01S 5/042* (2006.01)
*H01S 5/068* (2006.01)
*H01S 5/42* (2006.01)

(56) References Cited

U.S. PATENT DOCUMENTS

| | | | |
|---|---|---|---|
| 2008/0031294 A1* | 2/2008 | Krishnamoorthy | H01S 5/0612 385/14 |
| 2010/0284433 A1* | 11/2010 | Hata | H04N 9/3105 977/755 |
| 2011/0109655 A1* | 5/2011 | Takeda | G09G 3/3426 345/101 |
| 2016/0274223 A1* | 9/2016 | Imai | G01S 17/42 |
| 2017/0142393 A1* | 5/2017 | Oggier | H04N 13/20 |
| 2019/0181618 A1* | 6/2019 | Ge | G03B 21/204 |

FOREIGN PATENT DOCUMENTS

| | | |
|---|---|---|
| CN | 106662433 A | 5/2017 |
| CN | 108107663 A | 6/2018 |
| EP | 3070497 A1 | 9/2016 |
| JP | 2008066579 A | 3/2008 |
| JP | 2012-147279 A | 8/2012 |
| JP | 2012-195436 A | 10/2012 |
| JP | 2015-103727 A | 6/2015 |
| JP | 2016-176721 A1 | 10/2016 |
| JP | 2018-77071 A | 5/2018 |
| KR | 20110030780 A | 3/2011 |

* cited by examiner

LIGHT SOURCE DEVICE, DRIVE METHOD, AND SENSING MODULE

CROSS REFERENCE TO RELATED APPLICATIONS

This application is a U.S. National Phase of International Patent Application No. PCT/JP2019/023648 filed on Jun. 14, 2019, which claims priority benefit of Japanese Patent Application No. JP 2018-144923 filed in the Japan Patent Office on Aug. 1, 2018. Each of the above-referenced applications is hereby incorporated herein by reference in its entirety.

TECHNICAL FIELD

The present technology relates to a light source device including a light emitting unit in which multiple light emitting elements including vertical cavity surface emitting lasers are arranged, a drive method of the light emitting unit, and a sensing module including an image sensor that images by receiving light emitted from the light emitting unit and reflected by a subject.

BACKGROUND ART

As a light emitting element that emits laser light, a light emitting element as a vertical cavity surface emitting laser (VCSEL) is known (see Patent Documents 1 and 2 below, for example).

A light emitting element as a VCSEL is configured such that a resonator is formed in a direction perpendicular to a semiconductor substrate surface and emits laser light in the vertical direction. In recent years, a light emitting element as a VCSEL has widely been used as a light source when measuring the distance to a subject by the structured light (STL) method or the time of flight (ToF) method, for example.

CITATION LIST

Patent Document

Patent Document 1: Japanese Patent Application Laid-Open No. 2012-195436
Patent Document 2: Japanese Patent Application Laid-Open No. 2015-103727

SUMMARY OF THE INVENTION

Problems to be Solved by the Invention

Here, when measuring distance by the STL method or the ToF method as measurement of the distance to a subject, a light source in which multiple light emitting elements as VCSELs are arranged two-dimensionally is used. Specifically, the subject is irradiated with light obtained by causing the multiple light emitting elements to emit light, and the distance to the subject is measured on the basis of an image obtained by receiving light reflected from the subject.

When measuring distance in the above-described manner, conventionally, a drive method has been adopted in which multiple light emitting elements are caused to emit light simultaneously. Specifically, all the light emitting elements to be caused to emit light for distance measurement are caused to emit light simultaneously.

For this reason, the temperature of a chip on which the light emitting element is formed tends to rise, which may cause problems due to heat such as a decrease in luminous efficiency of the light emitting element and deterioration of the circuit characteristic of a drive circuit for driving the light emitting element.

The present technology has been made in view of the above circumstances, and aims to curb the temperature rise in a light source device including a light emitting unit in which multiple light emitting elements including vertical cavity surface emitting lasers are arranged.

Solutions to Problems

The light source device according to the present technology includes a light emitting unit in which multiple light emitting elements including vertical cavity surface emitting lasers are arranged, and a driving unit that, regarding the light emitting element in the light emitting unit, causes multiple light emitting elements to be caused to emit light in a light emission target period to emit light in a time-divided manner in the light emission target period.

By adopting time-division light emission, the number of light emitting elements that are caused to emit light simultaneously is reduced.

In the light source device according to the present technology described above, it is desirable that the light emission target period is synchronized with a frame period of an image sensor that receives light emitted from the light emitting unit and reflected by a subject.

This makes it possible for the light emitting element to emit light at an appropriate timing according to the frame cycle of the image sensor in a case where the subject is irradiated with light emitted by the light emitting unit and received by the image sensor for distance measurement.

In the light source device according to the present technology described above, it is desirable that the driving unit switches between simultaneous light emission driving of causing the multiple light emitting elements to emit light simultaneously in the light emission target period and division light emission driving of causing the multiple light emitting elements to emit light in a time-divided manner in the light emission target period.

By performing simultaneous light emission, in a case where the subject is irradiated with light emitted by the light emitting unit and received by the image sensor to perform distance measurement, a decrease in distance measurement accuracy for a moving subject is prevented.

In the light source device according to the present technology described above, it is desirable that the driving unit switches between the simultaneous light emission driving and the division light emission driving on the basis of the temperature.

This makes it possible to appropriately switch between simultaneous light emission and time-division light emission according to the temperature, such as switching from simultaneous light emission to time-division light emission in a case where the temperature rises to a predetermined value or higher, for example.

In the light source device according to the present technology described above, it is desirable that the driving unit sets the same total light emission amount of the light emitting unit for the simultaneous light emission driving and the division light emission driving.

This prevents difference in the amount of light received by the image sensor between simultaneous light emission driving and division light emission driving in a case where the subject is irradiated with light emitted by the light emitting unit and received by the image sensor for distance measurement.

In the light source device according to the present technology described above, it is desirable that the driving unit varies the number of the light emitting elements that are caused to emit light simultaneously in the time direction during the time-division light emission.

Since the mode of temperature rise changes depending on the number of light emitting elements that are caused to emit light simultaneously, according to the above configuration, it is possible to control the mode of temperature change in the time direction when time-division light emission is performed. Specifically, it is possible to control the mode of temperature change in the time direction so as to curb the temperature peak value in the light emission target period.

In the light source device according to the present technology described above, it is desirable that the driving unit reduces the number of light emitting elements that are caused to emit light simultaneously in the time direction during the time-division light emission.

When time-division light emission is performed, there is a possibility that the later the light emission order, the higher the ambient temperature has risen. For this reason, by reducing the number of light emitting elements that are caused to emit light simultaneously in the time direction, the number of light emitting elements that are caused to emit light in a later order is reduced from the number of light emitting elements that are caused to emit light in an earlier order.

In the light source device according to the present technology described above, it is desirable that the driving unit varies the number of simultaneous light emission groups, which are groups of the light emitting elements that are caused to emit light simultaneously during the time-division light emission, according to the temperature.

Increasing the number of simultaneous light emission groups leads to a decrease in the number of light emitting elements that are caused to emit light simultaneously, whereby the effect of curbing temperature rise is enhanced. On the other hand, increasing the number of simultaneous light emission groups leads to a decrease in distance measurement accuracy when the subject is moving. By varying the number of simultaneous light emission groups according to the temperature as described above, it is possible to achieve time-division light emission with an appropriate number of simultaneous light emission groups, such as increasing the number of simultaneous light emission groups when the temperature is high, and decreasing the number of simultaneous light emission groups when the temperature is low, for example.

In the light source device according to the present technology described above, it is desirable that the driving unit increases the number of the simultaneous light emission groups as the temperature rises.

As a result, it is possible to perform light emission driving with a higher effect of curbing temperature rise as the temperature rises.

In the light source device according to the present technology described above, it is desirable that the driving unit drives the light emitting elements so that adjacent light emitting regions in the light emitting unit are not caused to emit light consecutively during the time-division light emission.

Since the temperature rise is increased when adjacent light emitting regions are caused to emit light consecutively, the light emitting elements are driven so that adjacent light emitting regions are not caused to emit light consecutively as described above.

In the light source device according to the present technology described above, it is desirable that the driving unit drives the light emitting elements so that an inner light emitting region is caused to emit light after an outer light emitting region in the light emitting unit during the time-division light emission.

Since the light emitting unit tends to accumulate heat in the central portion, there is a possibility that the temperature rise may be increased if the light emission is started from the inner light emitting region. For this reason, as described above, the light emitting elements are driven so that the inner light emitting region is caused to emit light after the outer light emitting region.

Additionally, a drive method according to the present technology is a drive method including, regarding a light emitting element in a light emitting unit in which multiple light emitting elements including vertical cavity surface emitting lasers are arranged, causing multiple light emitting elements to be caused to emit light in a light emission target period to emit light in a time-divided manner in the light emission target period.

Moreover, a sensing module according to the present technology includes the light source device according to the present technology described above, and an image sensor that receives and captures light emitted from a light emitting unit included in the light source device and reflected by a subject.

An effect similar to that of the light source device according to the present technology described above can be obtained by such a drive method and sensing module.

Effects of the Invention

According to the present technology, it is possible to curb temperature rise in a light source device including a light emitting unit in which multiple light emitting elements including vertical cavity surface emitting lasers are arranged.

Note that the effect described herein is not necessarily limited, and the effect may be any of those described in the present disclosure.

MODE FOR CARRYING OUT THE INVENTION

Hereinafter, embodiments according to the present technology will be described in the following order with reference to the accompanying drawings.
<1. Configuration of distance measuring device>
<2. Distance measurement method>
<3. Circuit configuration related to light emission driving>
<4. Variation of substrate configuration>
<5. Structural example of VCSEL>
<6. Drive method as embodiment>
[6-1. Driving example I]
[6-2. Driving example II]
[6-3. Driving example III]
<7. Summary of embodiment and modification>
<8. Present technology>

<1. Configuration of Distance Measuring Device>

Figure 1:
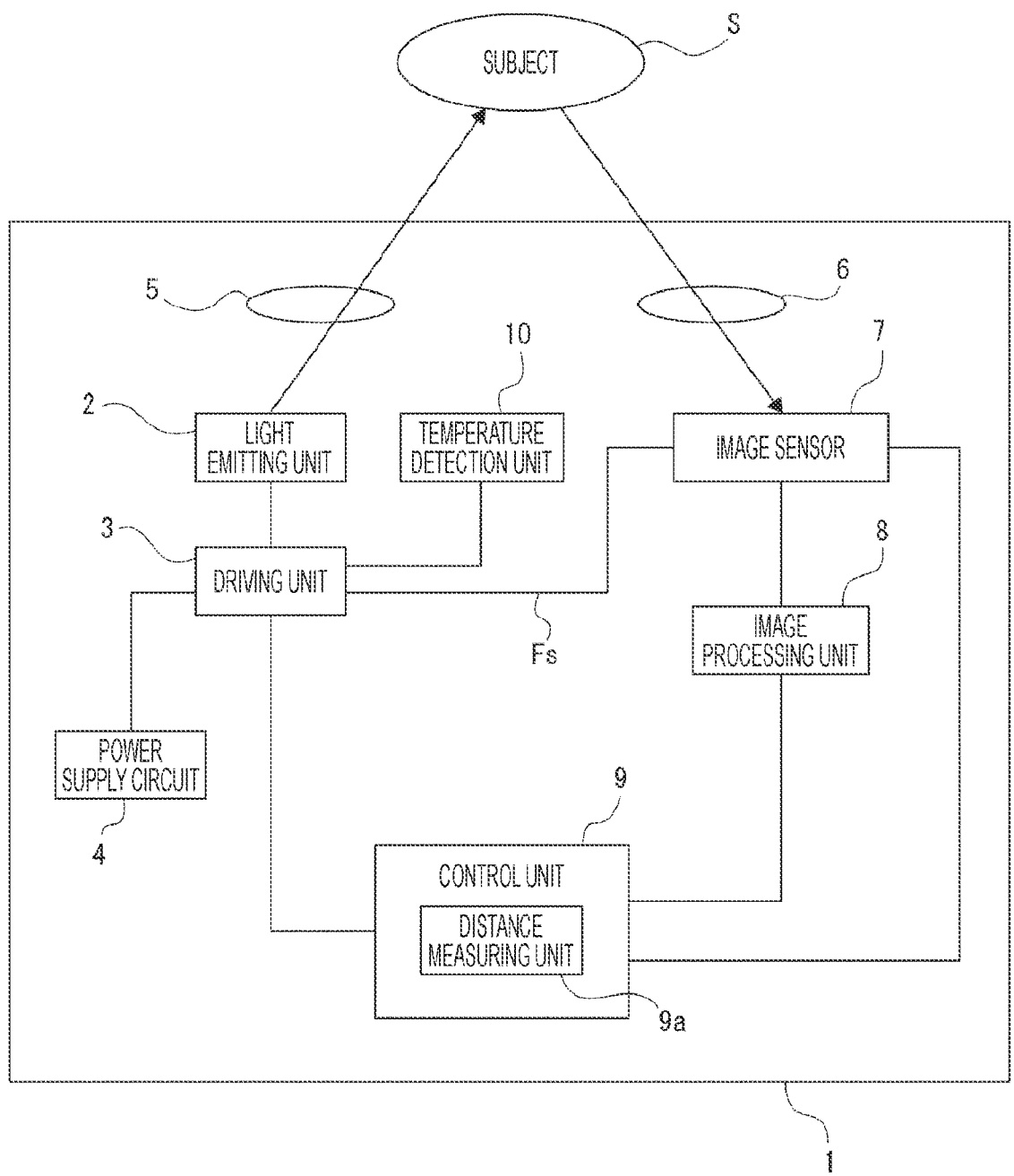
FIG. 1 is a diagram showing a configuration example of a distance measuring device as an embodiment of a light source device according to the present technology.

FIG. 1 shows a configuration example of a distance measuring device 1 as an embodiment of a light source device according to the present technology.

As shown in FIG. 1, the distance measuring device 1 includes a light emitting unit 2, a driving unit 3, a power supply circuit 4, a light emission side optical system 5, an imaging side optical system 6, an image sensor 7, an image processing unit 8, a control unit 9, and temperature detection unit 10.

The light emitting unit 2 emits light with multiple light sources. As will be described later, the light emitting unit 2 of this example has a light emitting element 2a including a vertical cavity surface emitting laser (VCSEL) as each light source, and the light emitting elements 2a are arranged in a predetermined form such as a matrix shape, for example.

The driving unit 3 includes an electric circuit for driving the light emitting unit 2.

The power supply circuit 4 generates a power supply voltage (drive voltage Vd described later) of the driving unit 3 on the basis of an input voltage (input voltage Vin described later) from a battery or the like (not shown) provided in the distance measuring device 1, for example. The driving unit 3 drives the light emitting unit 2 on the basis of the power supply voltage.

Light emitted from the light emitting unit 2 irradiates a subject S as a distance measuring target through the light emission side optical system 5. Then, the reflected light from the subject S of the light irradiated in this way is incident on an imaging surface of the image sensor 7 through the imaging side optical system 6.

For example, the image sensor 7 is an image sensor such as a charge coupled device (CCD) sensor or a complementary metal oxide semiconductor (CMOS) sensor, receives the reflected light from the subject S incident through the imaging side optical system 6 as described above, and converts the light into an electric signal to output the electric signal.

For example, the image sensor 7 performs correlated double sampling (CDS) processing, automatic gain control (AGC) processing, and the like on the electric signal obtained by photoelectric conversion of the received light, and further performs analog/digital (A/D) conversion processing. Then, the image signal as digital data is output to the image processing unit 8 in the subsequent stage.

Additionally, the image sensor 7 of this example outputs a frame synchronization signal Fs to the driving unit 3. As a result, the driving unit 3 can cause the light emitting elements 2a in the light emitting unit 2 to emit light at a timing corresponding to a frame cycle of the image sensor 7.

The image processing unit 8 is configured as an image processing processor by a digital signal processor (DSP) or the like, for example. The image processing unit 8 performs various image signal processing on the digital signal (image signal) input from the image sensor 7.

The control unit 9 includes a microcomputer having a central processing unit (CPU), a read only memory (ROM), a random access memory (RAM), and the like or an information processing device such as a DSP, for example, and performs control of the driving unit 3 to control a light emission operation by the light emitting unit 2 and control related to an imaging operation by the image sensor 7.

The control unit 9 has a function as a distance measuring unit 9a. The distance measuring unit 9a measures the distance to the subject S on the basis of an image signal (i.e., image signal obtained by receiving light reflected from subject S) input through the image processing unit 8. The distance measuring unit 9a of this example performs distance measurement for each part of the subject S in order to identify the three-dimensional shape of the subject S.

Here, the specific method of distance measurement in the distance measuring device 1 will be described later.

The temperature detection unit 10 detects the temperature of the light emitting unit 2. As the temperature detection unit 10, a configuration in which a diode is used to detect the temperature can be adopted, for example.

In this example, temperature information detected by the temperature detection unit 10 is supplied to the driving unit 3, which enables the driving unit 3 to drive the light emitting unit 2 on the basis of the temperature information.

<2. Distance Measurement Method>

As the distance measurement method of the distance measuring device 1, a distance measurement method using the structured light (STL) method or the time of flight (ToF) method can be adopted, for example.

The STL method is a method of measuring a distance on the basis of an image obtained by imaging the subject S irradiated with light having a predetermined light/dark pattern such as a dot pattern or a grid pattern, for example.

Figure 2A:
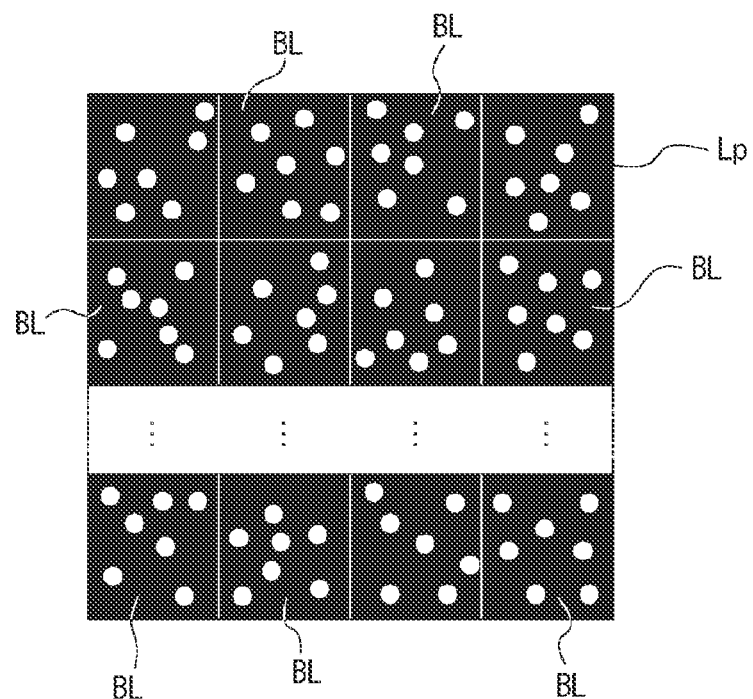
FIGS. 2A and 2B are explanatory diagrams of a distance measurement method using the structured light (STL) method.
Figure 2B:
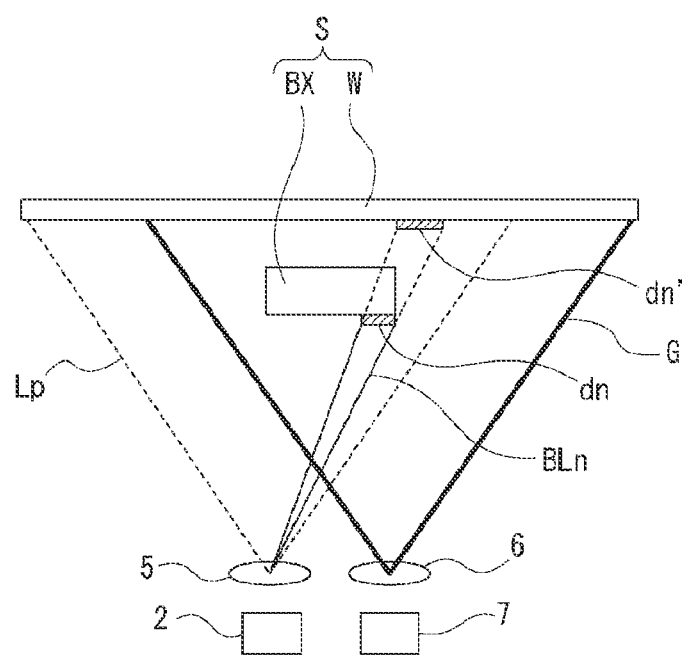

FIGS. 2A and 2B are explanatory diagrams of the STL method.

In the STL method, the subject S is irradiated with a pattern light Lp having a dot pattern as shown in FIG. 2A, for example. The pattern light Lp is divided into multiple blocks BL, and a different dot pattern is assigned to each block BL (overlap of dot patterns among the blocks BL is avoided).

FIG. 2B is an explanatory diagram of the distance measurement principle of the STL method.

Here, for example, a wall W and a box BX arranged in front of the wall W are regarded as the subject S, and the subject S is irradiated with the pattern light Lp. Reference sign "G" in FIG. 2B schematically represents the angle of view of the image sensor 7.

Additionally, reference sign "BLn" in FIG. 2B indicates light of a certain block BL in the pattern light Lp, and reference sign "dn" indicates the dot pattern of the block BLn projected on an image captured by the image sensor 7.

Here, in a case where the box BX in front of the wall W does not exist, the dot pattern of the block BLn is projected at the position of "dn" in FIG. 2B in the captured image. That is, the position where the pattern of the block BLn is projected in the captured image differs depending on whether the box BX is present or not, and specifically, the pattern is distorted.

The STL method is a method of obtaining the shape and depth of the subject S by utilizing the fact that the irradiated pattern is distorted by the object shape of the subject S as described above. Specifically, the STL method is a method of obtaining the shape and depth of the subject S from the distortion of the pattern.

In a case where the STL method is adopted, an infrared (IR) image sensor based on the global shutter method is used as the image sensor 7, for example. Then, in the case of the STL method, the distance measuring unit 9a controls the driving unit 3 so that the light emitting unit 2 emits pattern light, and also detects distortion of the pattern in an image signal obtained through the image processing unit 8 to calculate a distance on the basis of how the pattern is distorted.

Subsequently, the ToF method is a method of measuring the distance to the object by detecting flight time (time difference) of light emitted from the light emitting unit 2 until it is reflected by the object and reaches the image sensor 7.

In a case where the so-called direct ToF method is adopted as the ToF method, a single photon avalanche diode (SPAD) is used as the image sensor 7, and the light emitting unit 2 is pulse-driven. In this case, the distance measuring unit 9a calculates the time difference from light emission to light reception for light emitted from the light emitting unit 2 and received by the image sensor 7 on the basis of an image signal input through the image processing unit 8, and calculates the distance to each part of the subject S on the basis of the time difference and the speed of light.

Note that in a case where the so-called indirect ToF method (phase difference method) is adopted as the ToF method an IR image sensor is used as the image sensor 7, for example.

<3. Circuit configuration related to light emission driving>

Figure 3:
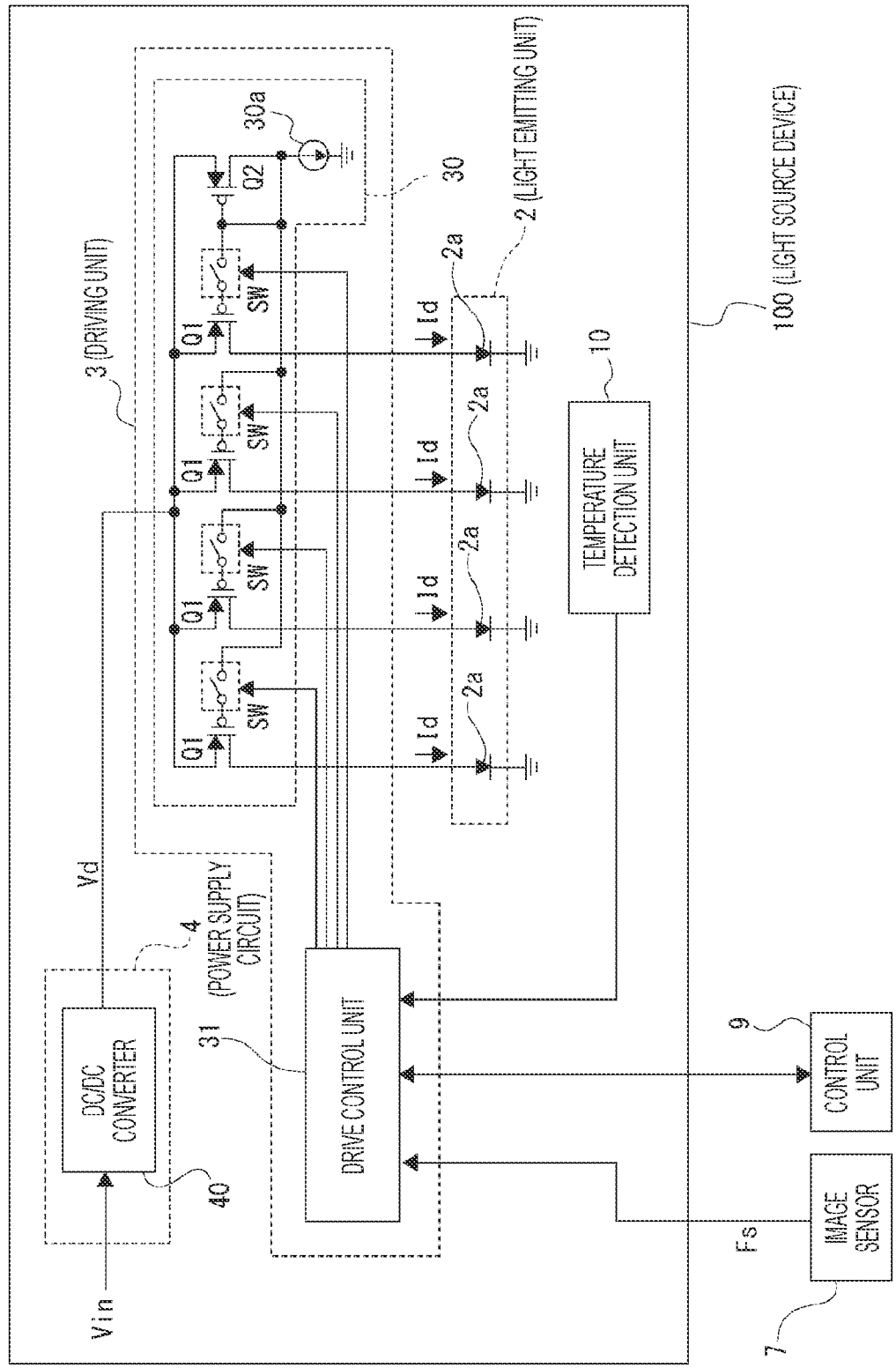
FIG. 3 is a diagram showing a circuit configuration example of the light source device as the embodiment.

FIG. 3 shows a circuit configuration example of a light source device 100 including the light emitting unit 2, the driving unit 3, and the power supply circuit 4 shown in FIG. 1. Note that FIG. 3 shows the image sensor 7 and the control unit 9 shown in FIG. 1 in addition to the circuit configuration example of the light source device 100.

In this example, the light emitting unit 2, the driving unit 3, and the power supply circuit 4 are formed on a common substrate (substrate B described later). Here, a unit including at least the light emitting unit 2 and formed on a substrate common to the light emitting unit 2 is referred to as the light source device 100.

As shown in FIG. 3, the light source device 100 includes the temperature detection unit 10 in addition to the light emitting unit 2, the driving unit 3, and the power supply circuit 4.

As described above, the light emitting unit 2 includes multiple light emitting elements 2a as VCSELs. While the number of light emitting elements 2a in FIG. 3 is set to "four" for convenience of illustration, the number of light emitting elements 2a in the light emitting unit 2 is not limited to this, and can be at least two or more.

The power supply circuit 4 includes a DC/DC converter 40, and generates the drive voltage Vd (DC voltage) used by the driving unit 3 to drive the light emitting unit 2, on the basis of the input voltage Vin by the DC voltage.

The driving unit 3 includes a drive circuit 30 and a drive control unit 31.

The drive circuit 30 has a switching element Q1 and a switch SW for each light emitting element 2a, and also has a switching element Q2 and a constant current source 30a.

A field-effect transistor (FET) is used for the switching element Q1 and the switching element Q2, and in this example, a P-channel metal-oxide-semiconductor (MOS) FET (MOSFET) is used.

Each switching element Q1 is connected in parallel to the output line of the DC/DC converter 40, that is, the supply line of the drive voltage Vd, and the switching element Q2 is connected in parallel to the switching element Q1.

Specifically, the source of each switching element Q1 and switching element Q2 is connected to the output line of the DC/DC converter 40. The drain of each switching element Q1 is connected to the anode of one corresponding light emitting element 2a among the light emitting elements 2a in the light emitting unit 2.

As shown in FIG. 3, the cathode of each light emitting element 2a is connected to the ground (GND).

In the switching element Q2, the drain is connected to the ground through the constant current source 30a, and the gate is connected to the connection point between the drain and the constant current source 30a.

The gate of each switching element Q1 is connected to the gate of the switching element Q2 through one corresponding switch SW.

In the drive circuit 30 having the above configuration, the switching element Q1 in which the switch SW is turned on conducts, the drive voltage Vd is applied to the light emitting element 2a connected to the conducting switching element Q1, and the light emitting element 2a emits light.

At this time, a drive current Id flows through the light emitting element 2a. In the drive circuit 30 having the above configuration, the switching element Q1 and the switching element Q2 form a current mirror circuit, and the current value of the drive current Id is a value corresponding to the current value of the constant current source 30a.

The drive control unit 31 controls ON/OFF of the light emitting element 2a by controlling ON/OFF of the switch SW in the drive circuit 30.

The frame synchronization signal Fs is supplied to the drive control unit 31 from the image sensor 7, which enables the drive control unit 31 to synchronize the ON timing and OFF timing of the light emitting element 2a with the frame cycle of the image sensor 7.

Additionally, the drive control unit 31 is capable of performing ON/OFF control of the light emitting element 2a on the basis of an instruction from the control unit 9.

Additionally, the drive control unit 31 of this example performs ON/OFF control of the light emitting element 2a on the basis of the temperature of the light emitting unit 2 detected by the temperature detection unit 10, which will be described later.

Figure 4:
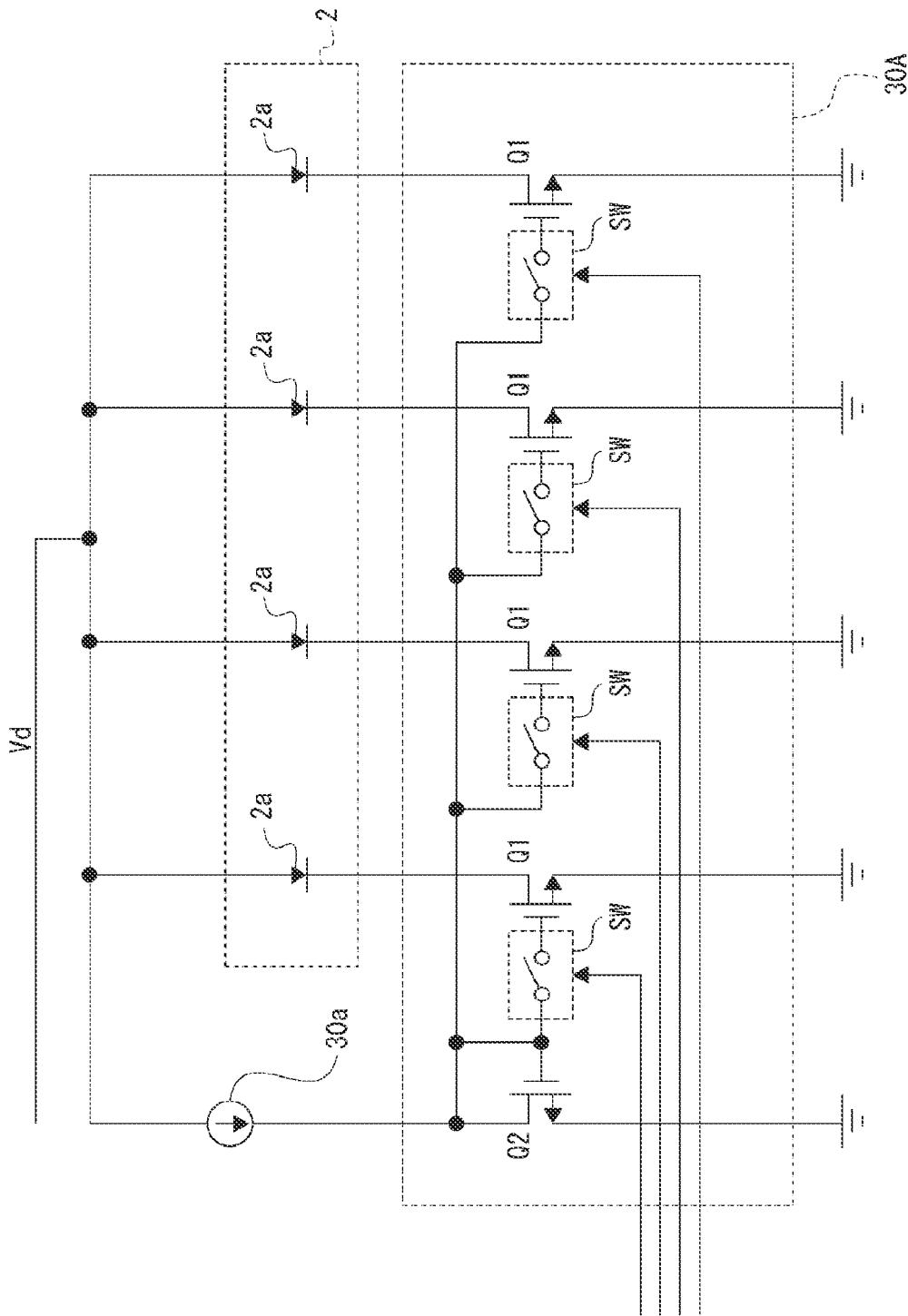
FIG. 4 is a diagram showing a modification of a drive circuit included in the light source device as the embodiment.

Here, while FIG. 3 illustrates a configuration in which the switching element Q1 is provided on the anode side of the light emitting element 2a, in an alternative configuration, a switching element Q1 can be provided on the cathode side of a light emitting element 2a as in a drive circuit 30A shown in FIG. 4.

In this case, the anode of each light emitting element 2a in a light emitting unit 2 is connected to the output line of a DC/DC converter 40.

An N-channel MOSFET is used for the switching element Q1 and a switching element Q2 that form a current mirror circuit. In the switching element Q2, the drain and gate are connected to the output line of the DC/DC converter 40 through the constant current source 30a, and the source is connected to the ground.

Each switching element Q1 has a drain connected to the cathode of the corresponding light emitting element 2a and a source connected to the ground. The gate of each switching element Q1 is connected to the gate and drain of the switching element Q2 through a corresponding switch SW.

In this case, too, the light emitting element 2a can be turned on and off by the drive control unit 31 performing ON/OFF control of the switch SW.

Figure 5:
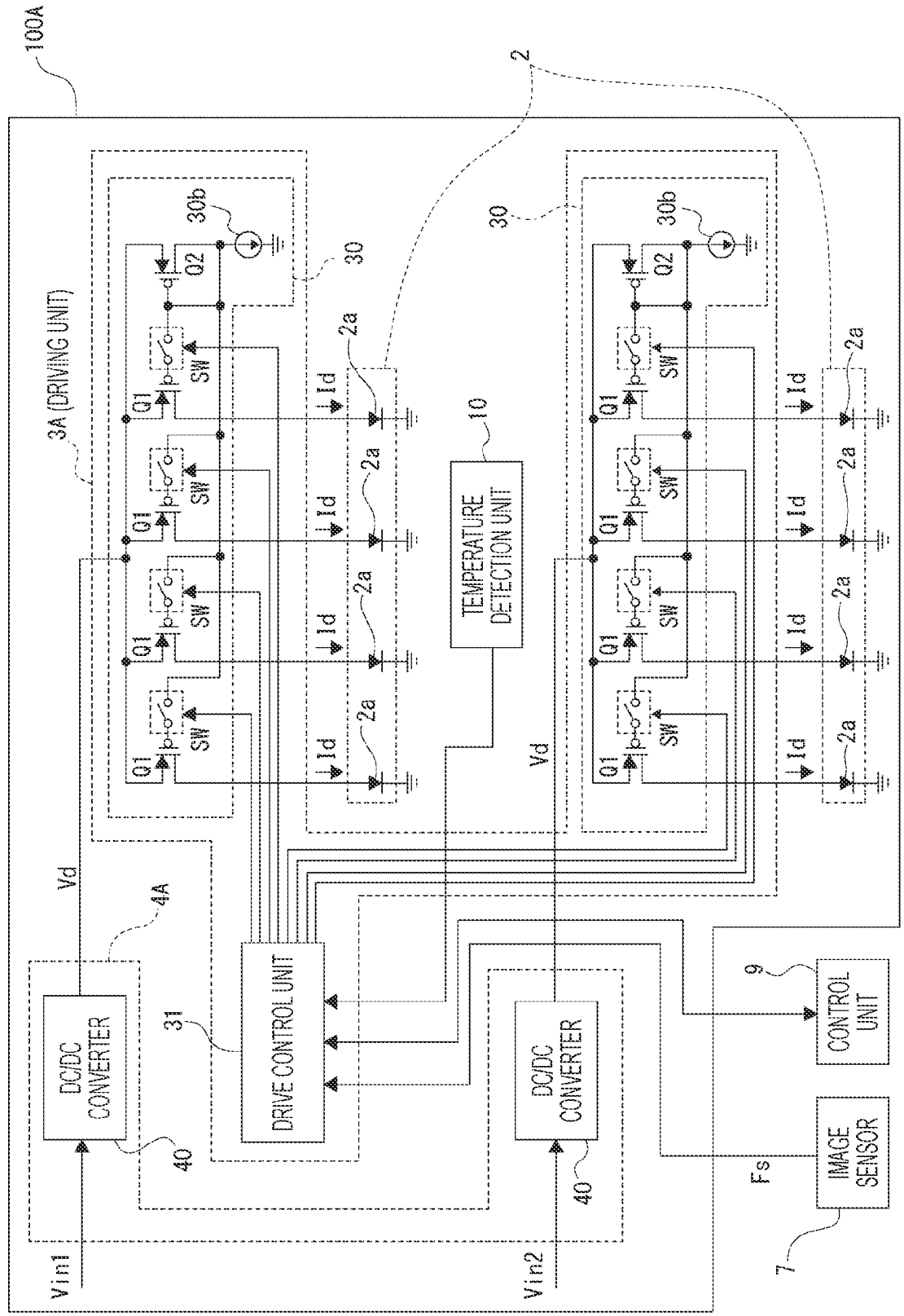
FIG. 5 is a diagram showing a circuit configuration as a modification of the light source device as the embodiment.

FIG. 5 shows a configuration example of a light source device 100A as a modification.

The light source device 100A is provided with a power supply circuit 4A instead of the power supply circuit 4, and a driving unit 3A instead of the driving unit 3.

The power supply circuit 4A has multiple DC/DC converters 40 (two in the example of FIG. 5). An input voltage Vin1 is supplied to one DC/DC converter 40, and an input voltage Vin2 is supplied to the other DC/DC converter 40. The driving unit 3A includes multiple drive circuits 30 that receive input of a drive voltage Vd from different DC/DC converters 40. As shown in FIG. 5, in each drive circuit 30, an adjustable current source 30b is provided instead of the constant current source 30a. The adjustable current source 30b is a current source having an adjustable current value.

In this case, light emitting elements 2a in a light emitting unit 2 are sorted into multiple light emitting element groups having different drive circuits 30 for ON/OFF control.

In this case, a drive control unit 31 controls ON/OFF of a switch SW in each drive circuit 30.

As in the light source device 100A, by separating at least the set of the DC/DC converter 40 and the drive circuit 30 into multiple systems, it is possible to set a different drive current Id of the light emitting element 2a for each system. For example, by setting a different voltage value of a drive voltage Vd and a different current value of an adjustable current source 30b for each system, a different drive current Id can be set for each system. Additionally, if the DC/DC converter 40 is configured to perform constant current control for the drive current Id, a different drive current Id can set for each system by setting a different target value of the constant current control for each DC/DC converter 40.

In a case where the configuration shown in FIG. 5 is adopted, it is conceivable to set a different value of the drive voltage Vd and the drive current Id for each system according to the emission intensity distribution, the temperature distribution, and the like in the light emitting unit 2. For example, it is conceivable to increase the drive current Id and increase the drive voltage Vd for a system corresponding to a location where the temperature is high in the light emitting unit 2.

<4. Variation of Substrate Configuration>

Here, the light source device 100 can be configured as shown in FIGS. 6A, 6B, 7A, 7B, 7C, 8A, and 8B.

Figure 6A:
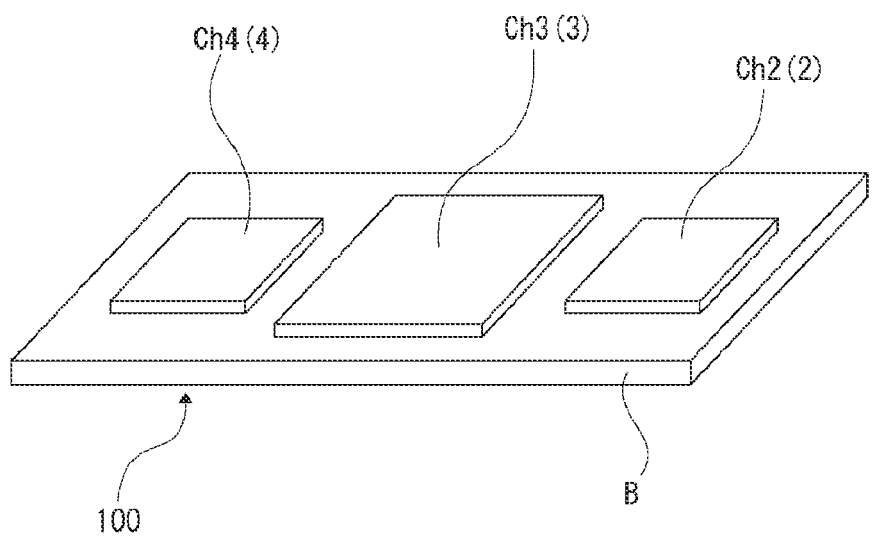
FIGS. 6A and 6B are diagrams showing a substrate configuration example of the light source device as the embodiment.

As shown in FIG. 6A, the light source device 100 can be configured such that a chip Ch2 in which a circuit as the light emitting unit 2 is formed, a chip Ch3 in which a circuit as the driving unit 3 is formed, and a chip Ch4 in which the power supply circuit 4 is formed are formed on the same substrate B.

Figure 6B:
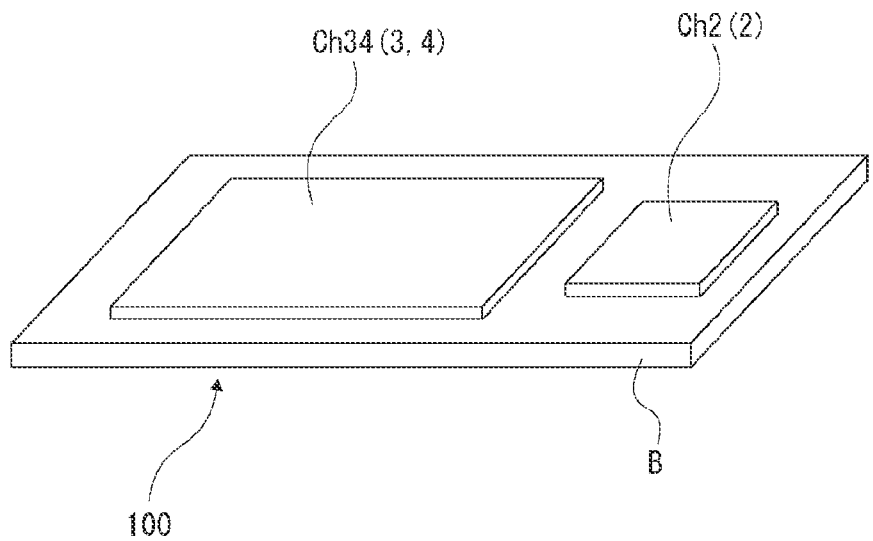

Alternatively, the driving unit 3 and the power supply circuit 4 can be formed on the same chip Ch34, and in that case, the light source device 100 can be configured such that the chip Ch2 and the chip Ch34 are formed on the same substrate B as shown in FIG. 6B.

Alternatively, it is also possible to mount another chip Ch on a chip Ch.

Figure 7A:
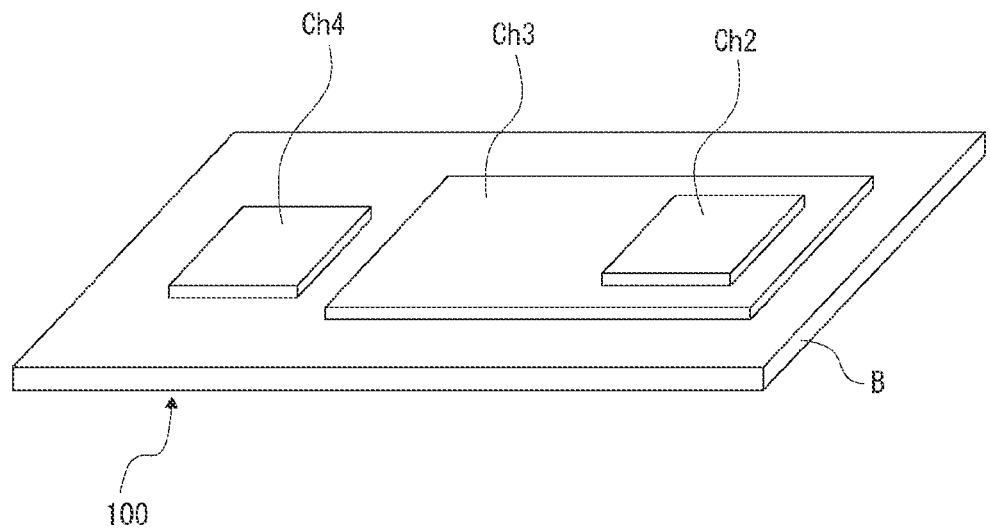
FIGS. 7A, 7B, and 7C are diagrams showing another substrate configuration example of the light source device as the embodiment.
Figure 7B:
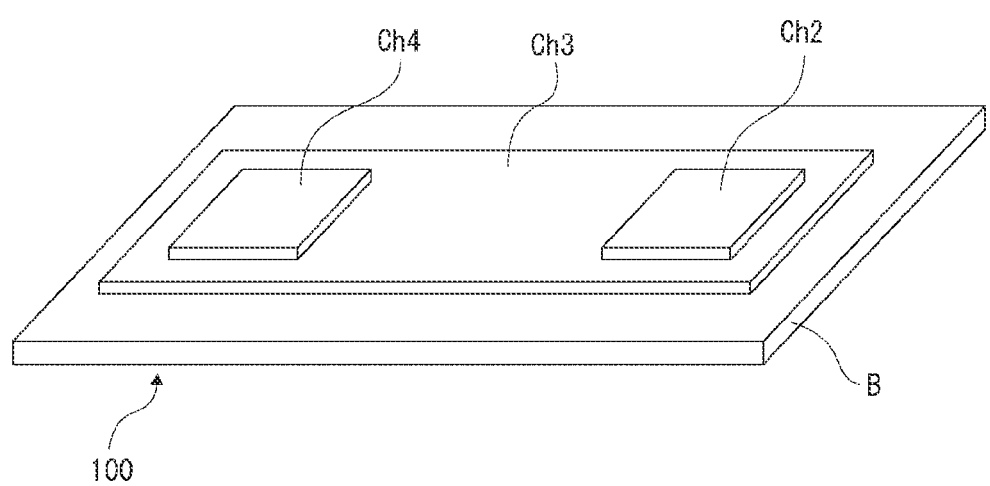
Figure 7C:
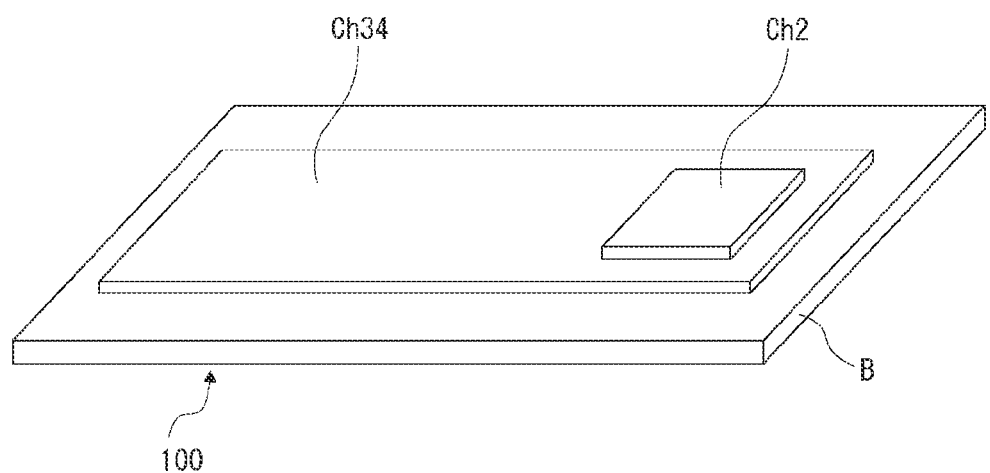

In that case, for example, the light source device 100 can be configured such that: the chip Ch3 on which the chip Ch2 is mounted and the chip Ch4 are formed on the substrate B as shown in FIG. 7A; the chip Ch3 on which the chip Ch2 and the chip Ch4 are mounted is formed on the substrate B as shown in FIG. 7B; or the chip Ch34 on which the chip Ch2 is mounted is formed on the substrate B as shown in FIG. 7C.

Alternatively, the light source device 100 may include the image sensor 7.

Figure 8A:
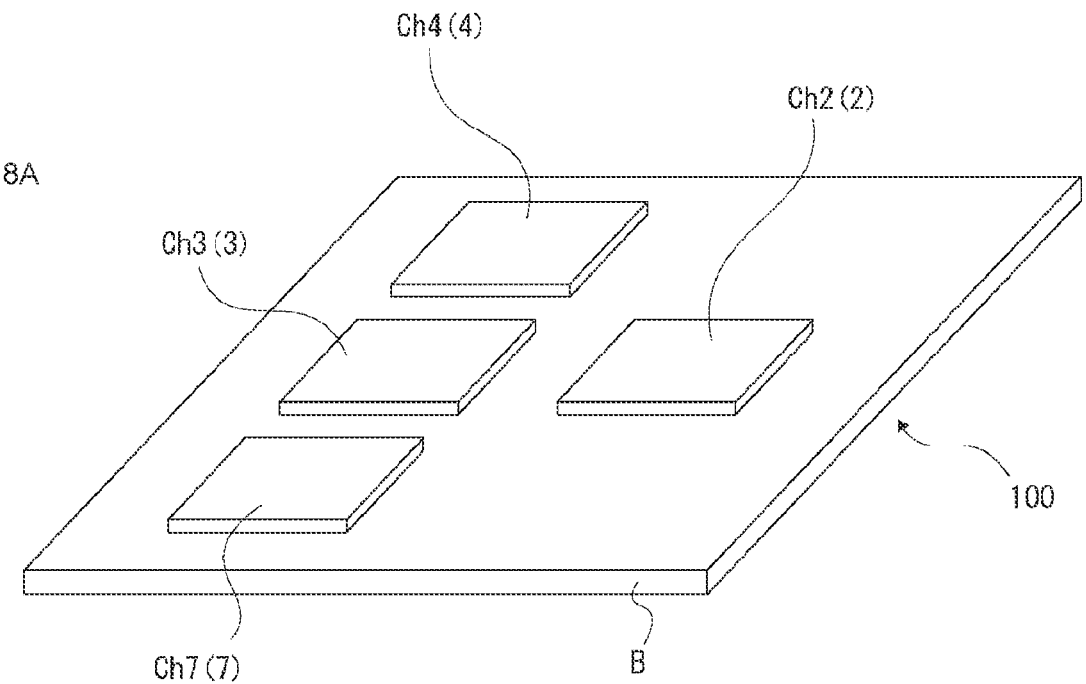
FIGS. 8A and 8B are diagrams showing still another substrate configuration example of the light source device as the embodiment.

For example, FIG. 8A illustrates a configuration of the light source device 100 in which a chip Ch7 in which a circuit as the image sensor 7 is formed is formed on the same substrate B as the chip Ch2, the chip Ch3, and the chip Ch4.

Figure 8B:
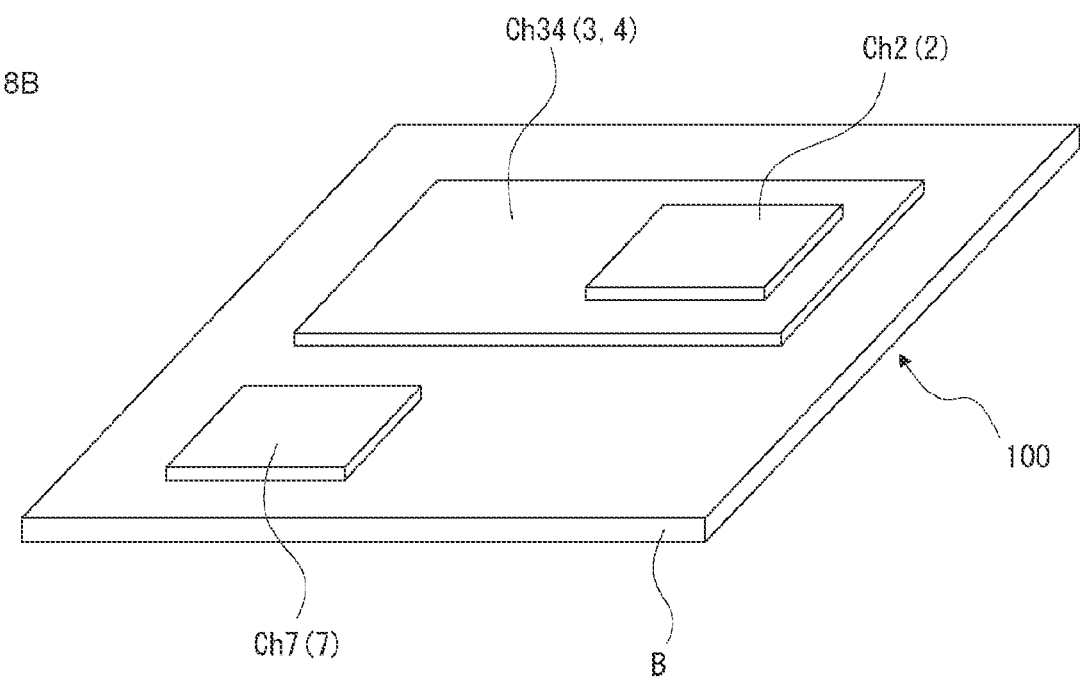

Alternatively, FIG. 8B illustrates a configuration of the light source device 100 in which the chip Ch34 on which the chip Ch2 is mounted and the chip Ch7 are formed on the same substrate B.

Note that the light source device 100A described above can also be configured in a similar manner as those described with reference to FIGS. 6A, 6B, 7A, 7B, 7C, 8A, and 8B.

Here, as for the temperature detection unit 10, in a case where the chip Ch2 is formed on the substrate B as shown in FIGS. 6A, 6B, and 8A, for example, a temperature detection element such as a diode only needs to be formed at a position in the vicinity of the chip Ch2 on the substrate B (e.g., a position on the side of the chip Ch2 on the substrate B, and the like).

Additionally, in a configuration in which the chip Ch2 is mounted on another chip Ch as shown in FIGS. 7A, 7B. 7C, and 8B, the temperature detection element only needs to be formed at a position in the vicinity of the chip Ch2 on the other chip Ch (e.g., a position directly below the chip Ch2, and the like).

The temperature detection unit 10 may have multiple temperature sensors 10a having a temperature detection element such as a diode.

Figure 9:
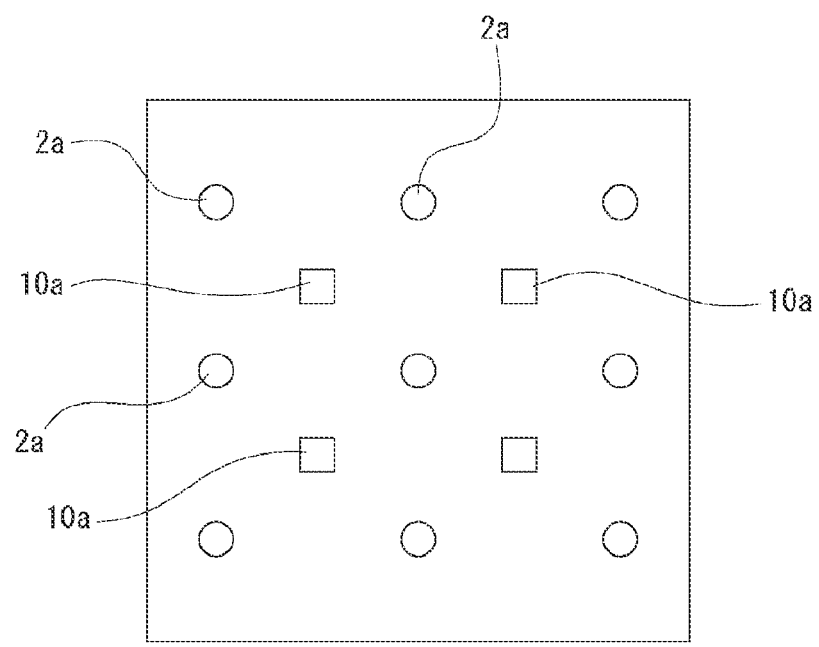
FIG. 9 is a diagram showing an arrangement example of temperature sensors included in the light source device as the embodiment.

FIG. 9 shows an arrangement example of each temperature sensor 10a in the case where the temperature detection unit 10 has multiple temperature sensors 10a.

In the example of FIG. 9, the multiple temperature sensors 10a are not concentrated in one place, but are arranged discretely in a plane parallel to a plane on which the light emitting elements 2a are arranged. Specifically, each one of the multiple temperature sensors 10a can be arranged for each light emitting block including a predetermined number of light emitting elements 2a such as four (two in the vertical direction and two in the horizontal direction), for example. At this time, the temperature sensors 10a can also be arranged at equal intervals in a plane parallel to the plane on which the light emitting elements 2a are arranged.

Note that while FIG. 9 shows an example in which four temperature sensors 10a are arranged for nine light emitting elements 2a, the number of light emitting elements 2a and temperature sensors 10a to be arranged is not limited to this.

By arranging the multiple temperature sensors 10a discretely as in the example of FIG. 9, it is possible to detect the in-plane temperature distribution of the light emitting unit 2. Additionally, the temperature of each area on the light emitting surface can be detected separately, and further, by increasing the number of temperature sensors 10a to be arranged, the temperature of each light emitting element 2a can be detected separately.

<5. Structural Example of VCSEL>

Subsequently, a structural example of the chip Ch2 in which the light emitting unit 2 is formed will be described with reference to FIGS. 10 and 11.

Figure 10:
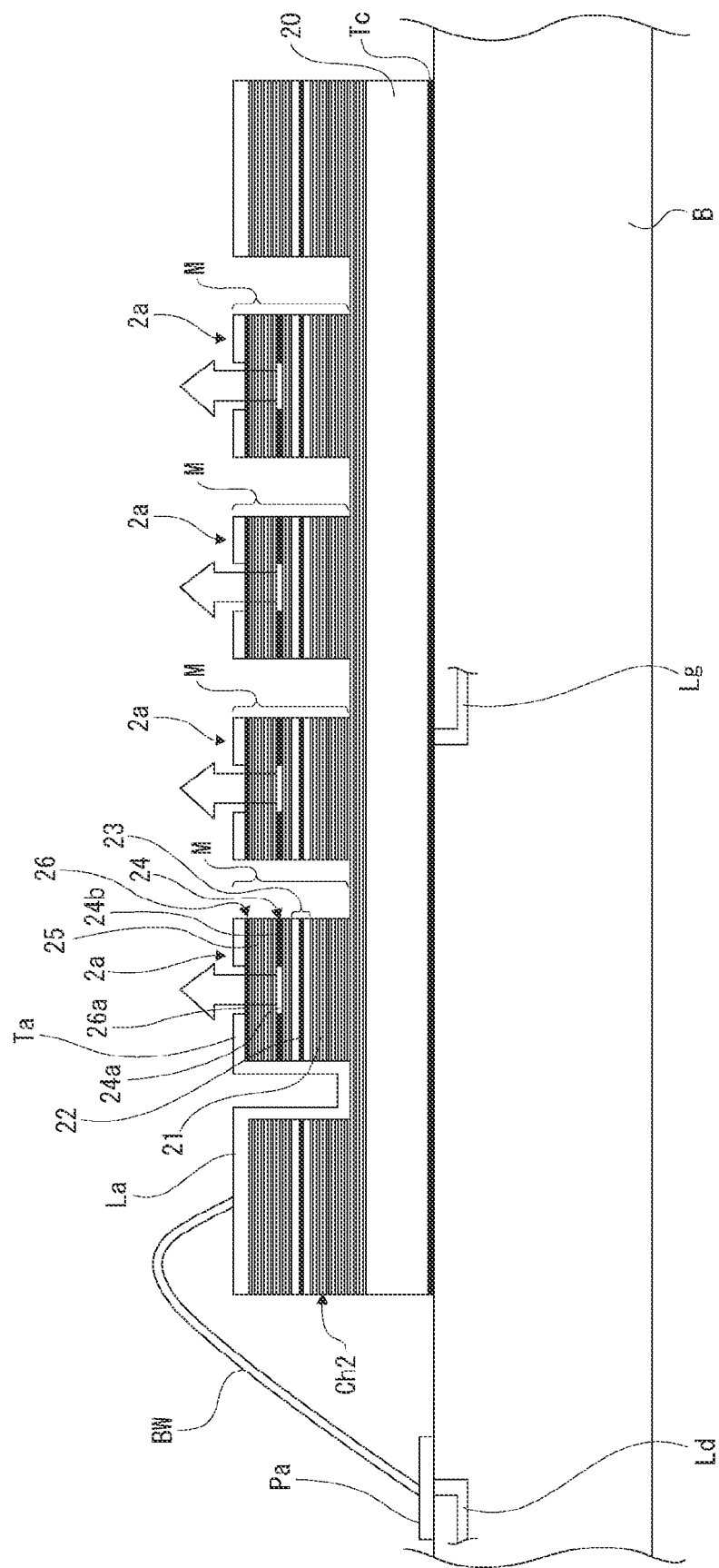
FIG. 10 is a diagram showing a structural example of a light emitting unit included in the light source device as the embodiment.

FIG. 10 shows a structural example of the chip Ch2 when formed on the substrate B as shown in FIGS. 6A, 6B, and 8A, and FIG. 11 shows a structural example of the chip Ch2 when mounted on another chip Ch as shown in FIGS. 7A[to], 7B, 7C, and 8B.

Figure 11:
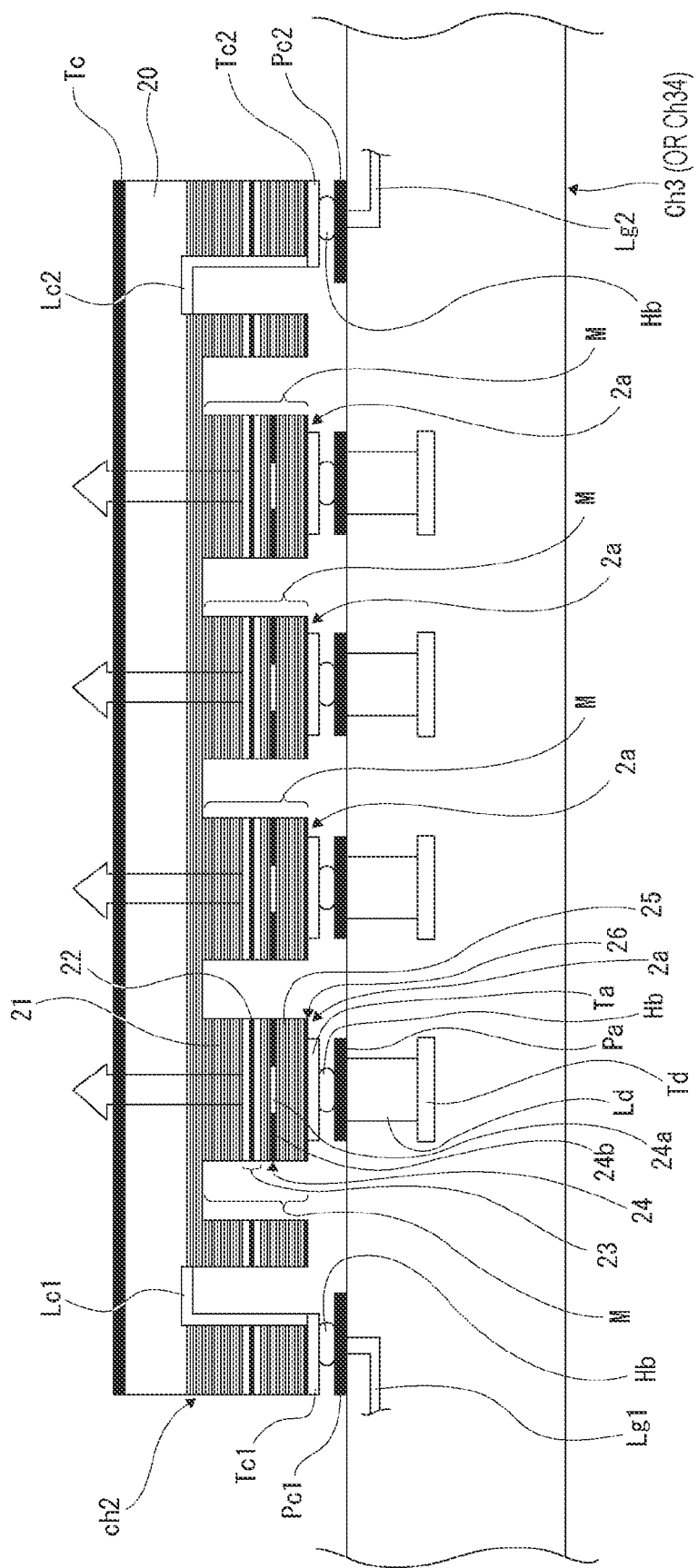
FIG. 11 is a diagram showing another structural example of the light emitting unit included in the light source device as the embodiment.

Note that FIGS. 10 and 11 show a structural example corresponding to a case where the drive circuit 30 is inserted on the anode side of the light emitting element 2a (see FIG. 3) as an example.

As shown in FIG. 10, in the chip Ch2, a portion corresponding to each light emitting element 2a is formed as a mesa M.

In the chip Ch2, a semiconductor substrate 20 is used as the substrate, and a cathode electrode Tc is formed on the lower layer side of the semiconductor substrate 20. A gallium arsenide (GaAs) substrate is used for the semiconductor substrate 20, for example.

On the semiconductor substrate 20, each mesa M has a first multilayer mirror layer 21, an active layer 22, a second multilayer mirror layer 25, a contact layer 26, and an anode electrode Ta are formed in this order from the lower layer side to the upper layer side.

A current constriction layer 24 is formed in a part (specifically, lower end portion) of the second multilayer mirror layer 25. Additionally, a portion including the active layer 22 and sandwiched between the first multilayer mirror layer 21 and the second multilayer mirror layer 25 is referred to as a resonator 23.

The first multilayer mirror layer 21 includes a compound semiconductor exhibiting N-type conductivity, and the second multilayer mirror layer 25 includes a compound semiconductor exhibiting P-type conductivity.

The active layer 22 is a layer for generating laser light, and the current constriction layer 24 is a layer that efficiently injects a current into the active layer 22 to bring about a lens effect.

After forming the mesa M, the current constriction layer 24 undergoes selective oxidation in an unoxidized state, and has a central oxidized region (or selectively oxidized region) 24a and an unoxidized unoxidized region 24b around the oxidized region 24a. In the current constriction layer 24, a current constriction structure is formed by the oxidized region 24a and the unoxidized region 24b, and a current is conducted to the current constriction region as the unoxidized region 24b.

The contact layer 26 is provided to ensure ohmic contact with the anode electrode Ta.

The anode electrode Ta is formed on the contact layer 26 in a shape having an open center such as an annular shape (ring shape), for example, in plan view of the substrate B. A portion of the contact layer 26 where the anode electrode Ta is not formed on its upper portion is an opening 26a.

Light generated in the active layer 22 reciprocates in the resonator 23 and then is emitted to the outside through the opening 26a.

Here, the cathode electrode Tc in the chip Ch2 is connected to the ground through ground wiring Lg formed in a wiring layer of the substrate B.

Additionally, in FIG. 10, a pad Pa represents a pad for an anode electrode formed on the substrate B. The pad Pa is connected to the drain of any one of the switching elements Q1 of the drive circuit 30 through wiring Ld formed in the wiring layer of the substrate B.

FIG. 10 shows that the anode electrode Ta is connected to one pad Pa through anode wiring La formed on the chip Ch2 and a bonding wire BW, for only one light emitting element 2a. However, the Pad Pa and the wiring Ld for each light emitting element 2a are formed in the substrate B, and the anode wiring La for each light emitting element 2a is formed on the chip Ch2. Hence, the anode electrode Ta of each light emitting element 2a is connected to the corresponding pad Pa through the corresponding anode wiring La and bonding wire BW.

Subsequently, in the case of FIG. 11, a back-illuminated chip Ch2 is used as the chip Ch2. That is, the example of FIG. 11 uses a chip Ch2 of a type that emits light in the back surface direction of the semiconductor substrate 20 instead of in the upper layer side direction (front surface direction) of the semiconductor substrate 20 as in the example of FIG. 10.

In this case, no opening for light emission is formed in the anode electrode Ta, and no opening 26a is formed in the contact layer 26.

In the chip Ch3 (or chip Ch34: hereinafter, the same applies to the description of FIG. 11) in which the driving unit 3 (drive circuit 30) is formed, a pad Pa for electrically connecting with the anode electrode Ta is formed for each light emitting element 2a. The wiring Ld is formed for each pad Pa in a wiring layer of the chip Ch3. Although not shown, each pad Pa is connected to the drain of one corresponding switching element Q1 in the drive circuit 30 formed in the chip Ch3 by the wiring Ld.

Additionally, in the chip Ch2, the cathode electrode Tc is connected to an electrode Tc1 and an electrode Tc2 through wiring Lc1 and wiring Lc2, respectively. The electrode Tc1 and electrode Tc2 are electrodes for connecting to a pad Pc1 and a pad Pc2 formed on the chip Ch3, respectively.

Ground wiring Lg1 connected to the pad Pc1 and ground wiring Lg2 connected to the pad Pc2 are formed in the wiring layer of the chip Ch3. Although not shown, the ground wirings Lg1 and Lg2 are connected to the ground.

The connection between each anode electrode Ta of the chip Ch2 and each pad Pa of the chip Ch3, and the connection between the electrode Tc1 and electrode Tc2 of the chip Ch2 and the pad Pc1 and pad Pc2 of the chip Ch3 are made through solder bumps Hb, respectively.

That is, the mounting of the chip Ch2 on the chip Ch3 in this case is performed by so-called flip chip mounting.

<6. Drive Method as Embodiment>

6-1. Driving Example I

Conventionally, when measuring distance by causing light emission from the light emitting unit 2 in which the multiple light emitting elements 2a as VCSELs are arranged as in the distance measuring device 1 described above, a drive method has been adopted in which the multiple light emitting elements 2a are caused to emit light simultaneously.

Figure 12:
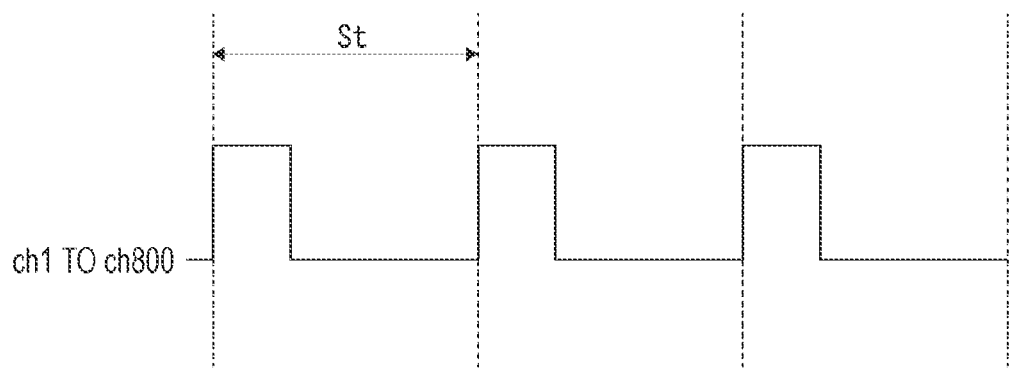
FIG. 12 is a diagram for describing an example of driving by simultaneous light emission.

FIG. 12 is a diagram for describing an example of such driving by simultaneous light emission.

First, as a premise, when measuring distance, the light emitting unit 2 is caused to emit light repeatedly in a constant light emission cycle. Specifically, the light emission cycle is synchronized with the frame cycle of the image sensor 7. A light emission target period St in FIG. 12 is synchronized with the frame period of the image sensor 7. For example, the frame rate of the image sensor 7 is 60 fps, and the light emission target period St is about 16.6 ms (milliseconds).

Here, in the following description, it is assumed that all the light emitting elements 2a in the light emitting unit 2 are caused to emit light for each light emission target period St when measuring distance. It is assumed that the number of light emitting elements 2a in the light emitting unit 2 is 800 for explanation. That is, the number of emission channels (ch) is 800, which includes ch1 to ch800.

As shown in FIG. 12, in the conventional drive system, the light emitting elements 2a of ch1 to ch800 are caused to emit light simultaneously for each light emission target period St. At this time, the period (ON period) for causing each light emitting element 2a to emit light is shorter than the light emission target period St, and is about 4 ms, for example.

In a case where the above-mentioned simultaneous light emission is performed, the temperature of the chip (chip Ch2) on which the light emitting element 2a is formed tends to rise, which, depending on the environmental temperature, may cause problems due to heat such as decrease in luminous efficiency of the light emitting element 2a and deterioration of the circuit characteristic of the drive circuit (drive circuit 30, 30A) for driving the light emitting element 2a.

Against this background, in the present embodiment, the multiple light emitting elements 2a (ch1 to ch800) to be caused to emit light in the light emission target period St are caused to emit light in a time-divided manner in the light emission target period St.

Figure 13:
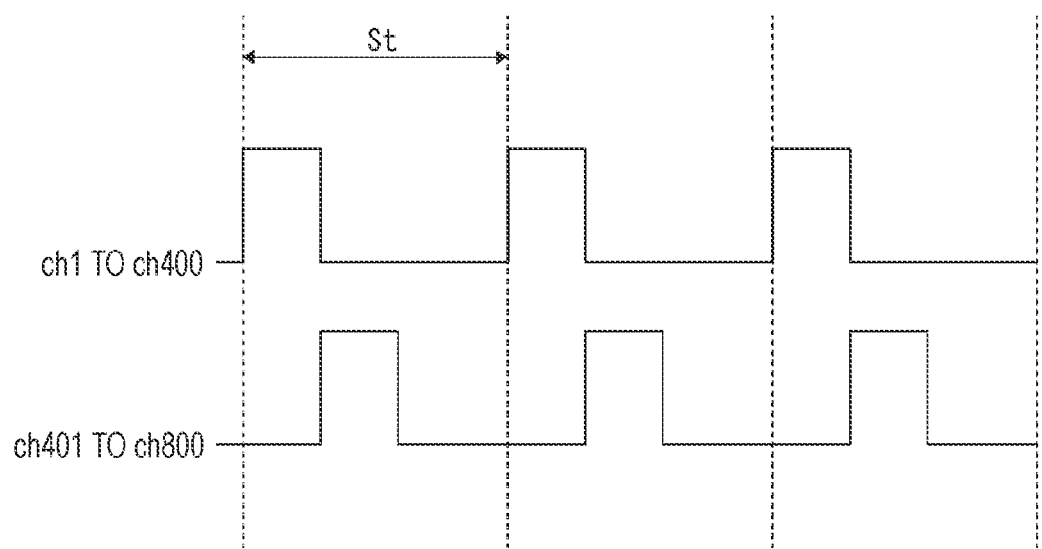
FIG. 13 is a diagram showing an example of time-division light emission.

FIG. 13 shows an example of time-division light emission.

FIG. 13 shows an example in which the 800 channels of light emitting elements 2a to be caused to emit light in the light emission target period St are divided into two, and in the light emission target period St, after causing the 400 light emitting elements 2a of ch1 to ch400 to emit light, the remaining 400 light emitting elements 2a of ch401 to ch800 are caused to emit light.

Figure 14:
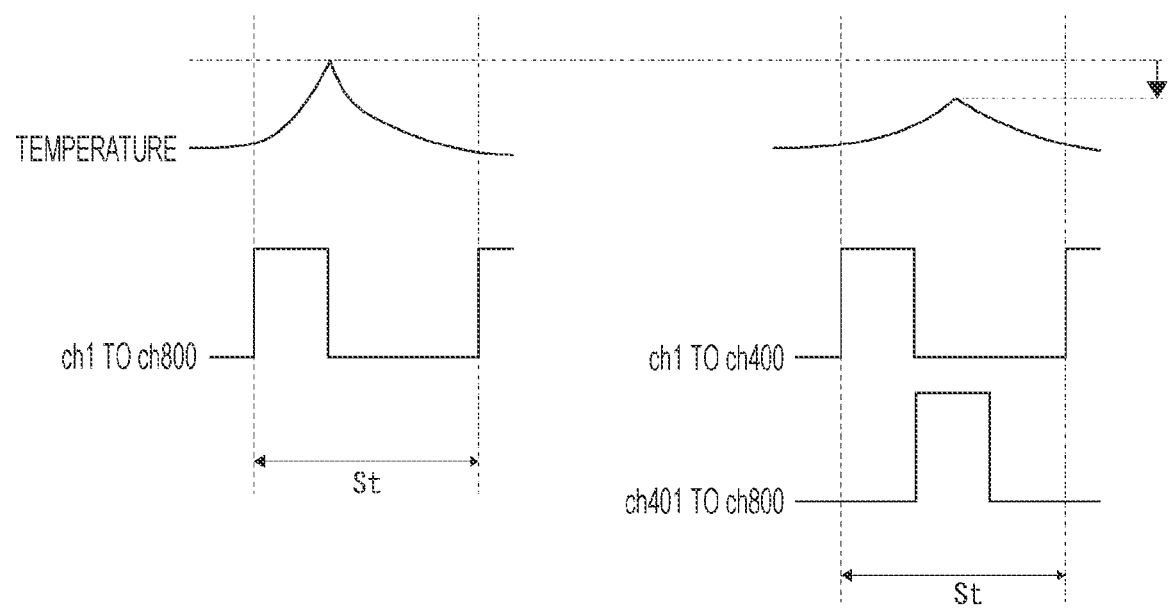
FIG. 14 is a diagram for describing the effect of time-division light emission.

By performing such time-division light emission, as shown in FIG. 14, it is possible to curb the peak value of the temperature as compared with the case of simultaneous light emission. That is, it is possible to curb temperature rise of the chip Ch2.

The time-division light emission as described above is achieved by the drive control unit 31 controlling the switch SW. In this example, the drive control unit 31 has a logic circuit, and the logic circuit controls the switch SW for time-division light emission as described above.

The example of time-division light emission is not limited to the above-mentioned two-part division of ch1 to ch400 and ch401 to ch800, and may be a three or more-part division.

At this time, the number of light emitting elements 2a that are caused to emit light simultaneously in time-division light emission may be varied in the time direction. For example, after causing 400 light emitting elements 2a of ch1 to ch400 to emit light, 200 light emitting elements 2a of ch401 to ch600 are caused to emit light, and then the remaining 200 light emitting elements 2a of ch601 to ch800 can be caused to emit light. That is, the number of light emitting elements 2a that are caused to emit light simultaneously in time-division light emission is reduced in the time direction.

When time-division light emission is performed, there is a possibility that the later the light emission order, the higher the ambient temperature has risen. For this reason, by reducing the number of light emitting elements 2a that are caused to emit light simultaneously in the time direction as described above, that is, by reducing the number of light emitting elements 2a emitted in a later order from the number of light emitting elements 2a emitted in an earlier order, it is possible to curb the temperature peak value in the light emission target period St and enhance the effect of curbing temperature rise.

Here, the drive control unit 31 of this example is capable of switching between simultaneous light emission driving of causing the light emitting elements 2a to emit light simultaneously as illustrated in FIG. 12, and time-division light emission driving of causing the light emitting elements 2a to emit light in a time-divided manner as illustrated in FIG. 13. Specifically, the drive control unit 31 switches between simultaneous light emission driving and time-division light emission driving on the basis of the temperature detected by the temperature detection unit 10.

The decrease in luminous efficiency of the light emitting element 2a becomes relatively obvious in a region of 70° C. or higher, for example. For this reason, it is conceivable to set a value of 70° C. or less, for example, as a temperature threshold TH, and switch between simultaneous light emission driving and time-division light emission driving with reference to the threshold TH.

Figure 15:
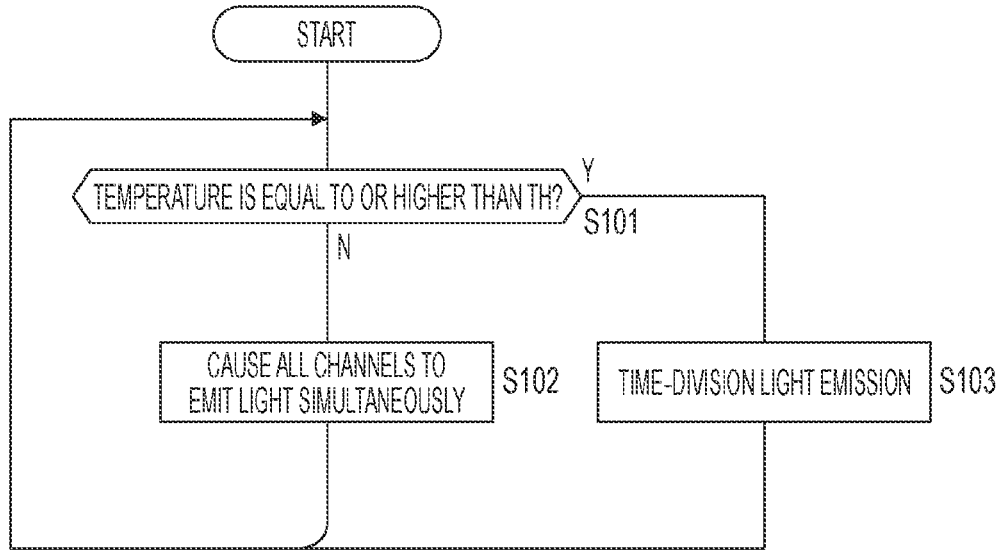
FIG. 15 is a flowchart illustrating the flow of operation in a case of switching between simultaneous light emission driving and time-division light emission driving according to the temperature.

The flowchart of FIG. 15 illustrates the flow of operation of the drive control unit 31 in a case of switching between simultaneous light emission driving and time-division light emission driving according to the temperature.

As shown in FIG. 15, if the temperature detected by the temperature detection unit 10 is not equal to or higher than the threshold TH (step S101: N), the drive control unit 31 causes the light emitting elements 2a of all channels to emit light simultaneously (step S102). On the other hand, if the temperature detected by the temperature detection unit 10 is equal to or higher than the threshold TH (step S101: Y), the drive control unit 31 causes the light emitting elements 2*a* to emit light in a time-divided manner (step S103).

At this time, the temperature detected by the temperature detection unit 10 is the temperature detected by the temperature sensor 10*a* if the temperature detection unit 10 includes only one temperature sensor 10*a*. Alternatively, if the temperature detection unit 10 includes multiple temperature sensors 10*a*, the representative value of the temperatures detected by the temperature sensors 10*a* is adopted. It is conceivable to use the average value of the detected temperatures of the multiple temperature sensors 10*a* as the representative value, for example. Alternatively, it is also conceivable to use the temperature detected by one predetermined temperature sensor 10*a* (e.g., temperature sensor 10*a* having highest detection temperature) as the representative value.

Here, the drive control unit 31 drives the light emitting elements 2*a* so that the total light emission amount (total light emission amount in light emission target period St) of the light emitting unit 2 during time-division light emission driving is the same as that at the time of simultaneous light emission driving. Specifically, for example, if the ON period of each light emitting element 2*a* during simultaneous light emission driving is 4 ms as described above, the ON period of each light emitting element 2*a* during time-division light emission driving is also 4 ms.

Note that in a case where the DC/DC converter 40 and the drive circuit 30 are separated into multiple systems as illustrated in FIG. 5, the ON periods of the light emitting element 2*a* are matched and the values of the drive current Id are matched for the drive circuits 30, for example, so that the total light emission amount is the same.

By performing simultaneous light emission driving, even if the subject S as the target of distance measurement moves, it is possible to prevent the reflected light when the subject S is at a different position from being received collectively within one frame period, and prevent degradation of distance measurement accuracy.

By switching between time-division light emission driving and simultaneous light emission driving as described above, it is possible to both prevent degradation of distance measurement accuracy and curb temperature rise.

Note that it is not essential to switch between simultaneous light emission driving and time-division light emission driving, and it is possible to perform time-division light emission driving at all times.

6-2. Driving Example II

In driving example II, the number of simultaneous light emission groups during time-division light emission is varied according to the temperature. Here, a simultaneous light emission group means a group of light emitting elements 2*a* that are caused to emit light simultaneously in time-division light emission. For example, in time-division light emission of driving the 800 channels of light emitting elements 2*a* 400 channels at a time as illustrated above, each group of 400 channels of light emitting elements 2*a* corresponds to the simultaneous light emission group.

In this example, the number of simultaneous light emission groups is increased as the temperature rises.

Figure 16:
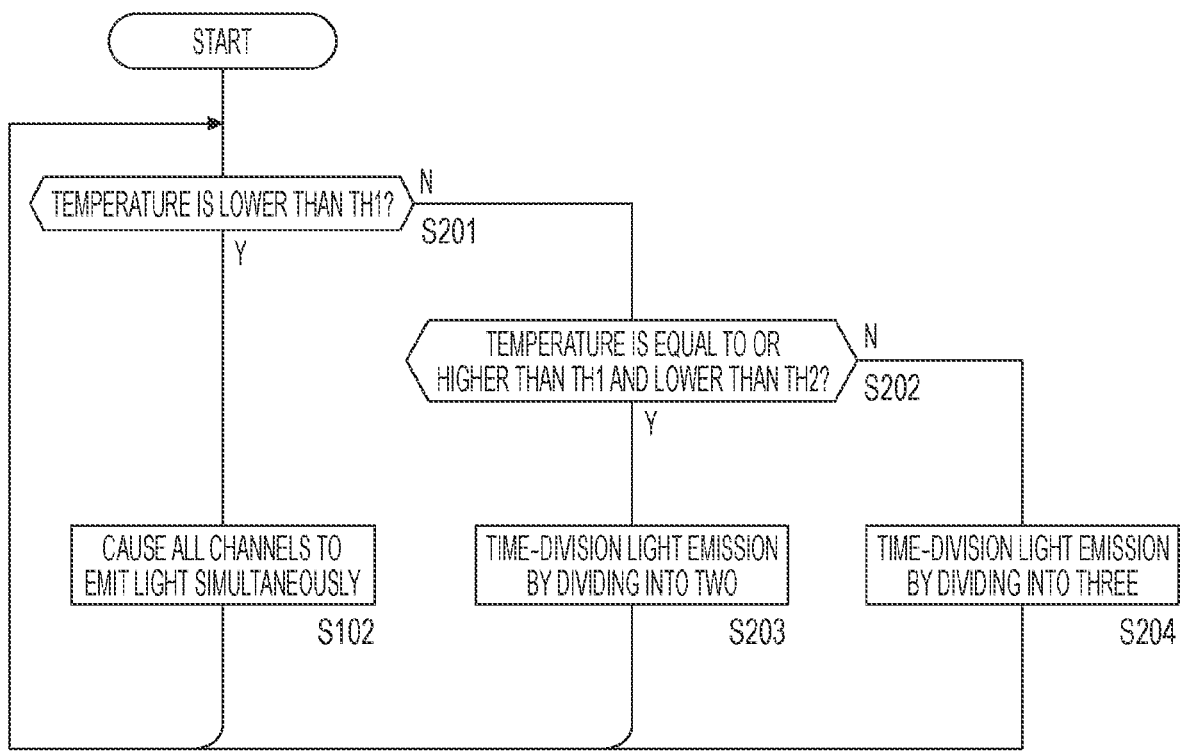
FIG. 16 is a flowchart showing the flow of operation as driving example II.

FIG. 16 is a flowchart showing the flow of operation as driving example II performed by the drive control unit 31.

First, in this example, multiple thresholds TH are set as the threshold TH for the temperature detected by the temperature detection unit 10. Here, for example, a first threshold TH1 and a second threshold TH2 having a value larger than the first threshold TH1 are set.

If the temperature detected by the temperature detection unit 10 is lower than the first threshold TH1 (step S201: Y), the drive control unit 31 performs simultaneous light emission driving (step S102). Alternatively, if the temperature detected by the temperature detection unit 10 is equal to or higher than the first threshold TH1 and lower than the second threshold TH2 (step S202: Y), the drive control unit 31 performs time-division light emission by dividing into two (step S203). That is, time-division light emission driving of the light emitting elements 2*a* is performed by setting the number of simultaneous light emission groups to "2". Specifically, time-division light emission driving of 400 channels and 400 channels is performed, for example.

Alternatively, if the temperature detected by the temperature detection unit 10 is equal to or higher than the second threshold TH2 (step S202: N), the drive control unit 31 performs time-division light emission by dividing into three (step S204). That is, time-division light emission driving of the light emitting elements 2*a* is performed by setting the number of simultaneous light emission groups to "3". For example, time-division light emission driving of 400 channels→200 channels→200 channels is performed.

By increasing the number of simultaneous light emission groups according to the temperature rise as described above, it is possible to perform light emission driving in which the effect of curbing the temperature rise is further enhanced as the temperature rises.

Accordingly, problems due to temperature rise are less likely to occur.

Here, the first threshold TH1 is set to the same value as the above-mentioned threshold TH (e.g., about 70° C.), and the second threshold TH2 is set to a temperature lower than the allowable upper limit temperature (e.g., 130° C. of the specification of the chip Ch2, for example. As a result, when the temperature rises to the extent that the luminous efficiency is expected to decrease, time-division light emission driving can be performed by dividing into two, and when the temperature rises to the extent that the allowable upper limit temperature is expected to be reached, time-division light emission driving can be performed by dividing into three, that is, time-division light emission driving with a higher effect of curbing temperature rise can be performed.

<6-3. Driving Example III>

Driving example III relates to dividing regions of the simultaneous light emission groups and the light emission order for each region.

Figure 17:
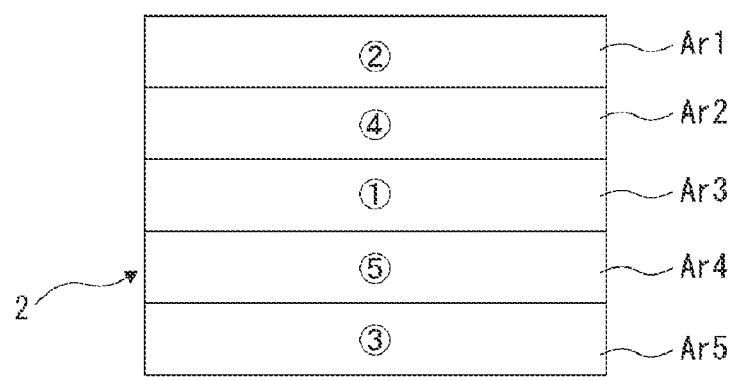
FIG. 17 is a diagram showing an example of a drive method in which adjacent light emitting regions are not caused to emit light consecutively.

For example, consider a case where the light emitting unit 2 is divided in the vertical direction into multiple light emitting regions Ar as shown in FIG. 17, and the light emitting elements 2*a* in each light emitting region Ar form a simultaneous light emission group to perform time-division light emission driving.

For example, in the case where the light emitting regions Ar are divided as shown in FIG. 17, if adjacent light emitting regions Ar are consecutively caused to emit light, the temperature rise is increased even more. Against this background, the drive control unit 31 drives the light emitting element 2*a* so that adjacent light emitting regions Ar are not caused to emit light consecutively. As a result, the effect of curbing temperature rise is enhanced.

For example, in a case where the light emitting unit 2 is divided into five light emitting regions Ar of light emitting regions Ar1, Ar2, Ar3, Ar4, and Ar5 in order from the upper side as in the example of FIG. 17, the drive control unit 31 causes the light emitting elements 2*a* to emit light in the order of the light emitting regions Ar3→Ar1→Ar5→Ar2→Ar4 as indicated by the numbers represented for each light emitting region Ar in FIG. 17.

Figure 18:
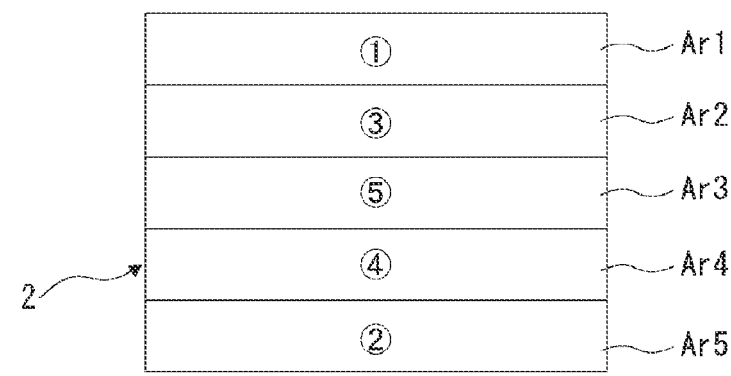
FIG. 18 is a diagram showing another example of the drive method in which adjacent light emitting regions are not caused to emit light consecutively.

Alternatively, as illustrated in FIG. 18, the light emitting elements 2a can be caused to emit light in the order of the light emitting regions Ar1→Ar5→Ar2→Ar4→Ar3. Note that in the example of FIG. 18, in the end, adjacent light emitting regions Ar are caused to emit light consecutively as in "Ar4→Ar3". However, adjacent light emitting regions Ar are not caused to emit light consecutively up to "Ar1→Ar5→Ar2→Ar4", and in this respect, the example of FIG. 18 is one type of the method of driving the light emitting elements 2a so that adjacent light emitting regions Ar are not caused to emit light consecutively.

Here, the method of not causing adjacent light emitting regions Ar to emit light consecutively as described above can also be combined with the method of reducing the number of light emitting elements 2a that are caused to emit light simultaneously in the time direction as illustrated above. For example, in the example of FIG. 18, the number of light emitting elements 2a in the first and second light emitting regions Ar1 and Ar5 can be set to 200 each, the number of light emitting elements 2a in the third and fourth light emitting regions Ar2 and Ar4 can be set to 150 each, and the number of light emitting elements 2a in the last light emitting region Ar3 can be set to 100, for example.

Figure 19:
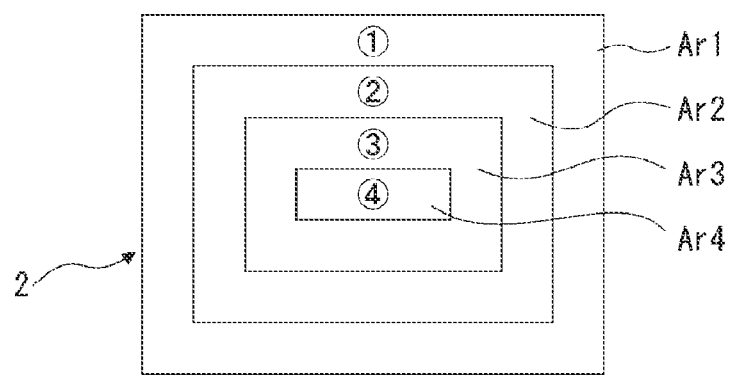
FIG. 19 is a diagram showing an example of a drive method of causing an inner light emitting region to emit light after an outer light emitting region.

Alternatively, as the mode of dividing the light emitting regions Ar in the light emitting unit 2, as illustrated in FIG. 19, for example, it is also possible to divide into multiple light emitting regions Ar from the center toward the outside. Specifically, in the dividing mode of FIG. 19, the region shape is set so that each light emitting region Ar surrounds the periphery of the light emitting region Ar on the inside thereof, except for the light emitting region Ar in the central portion.

Here, since the light emitting unit 2 tends to accumulate heat in the central portion, there is a possibility that the temperature rise may be increased if the light emission is started from the inner light emitting region Ar during the time-division light emission. For this reason, in a case where the light emitting regions Ar are divided as illustrated in FIG. 19, for example, the drive control unit 31 drives the light emitting elements 2a so that the inner light emitting region Ar emits light after the outer light emitting region Ar in the light emitting unit 2. For example, in a case where four light emitting regions Ar of light emitting regions Ar1, Ar2, Ar3, and Ar4 are set in order from the outside to the inside as shown in FIG. 19, the drive control unit 31 causes the light emitting regions Ar to emit light in the order of the light emitting regions Ar1→Ar2→Ar3→Ar4, for example.

Figure 20:
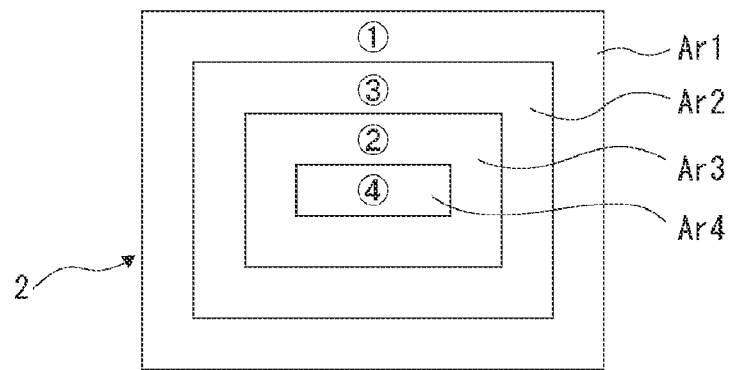
FIG. 20 is a diagram showing another example of the drive method of causing an inner light emitting region to emit light after an outer light emitting region.

Alternatively, as illustrated in FIG. 20, the light emitting regions Ar may be caused to emit light in the order of light emitting regions Ar1→Ar3→Ar2→Ar4. Note that in the method shown in FIG. 20, in the light emission of each of "Ar1→Ar3" and "Ar2→Ar4", the inner light emitting region Ar is caused to emit light after the outer light emitting region Ar.

By driving the light emitting elements 2a so that the inner light emitting region Ar is caused to emit light after the outer light emitting region Ar as described above, it is possible to prevent light emission from starting from the central portion of the light emitting unit 2, which can enhance the effect of curbing temperature rise.

Note that the drive method shown in FIG. 18 above is also one type of the method for driving the light emitting elements 2a so that the inner light emitting region Ar is caused to emit light after the outer light emitting region Ar.

The drive methods illustrated in FIGS. 19 and 20 can also be combined with the method of reducing the number of light emitting elements 2a that are caused to emit light simultaneously in the time direction. For example, in the example of FIG. 19, the number of light emitting elements 2a in the light emitting region Ar1 can be set to 300, the number of light emitting elements 2a in the light emitting region Ar2 can be set to 250, the number of light emitting elements 2a in the light emitting region Ar3 can be set to 150, and the number of light emitting elements 2a in the light emitting region Ar4 can be set to 100, for example.

Note that the time-division light emission driving method as driving example III described with reference to FIGS. 17 to 20 can be combined with the drive method of varying the number of simultaneous light emission groups in the time direction as in driving example II.

<7. Summary of Embodiment and Modification>

As described above, a light source device (distance measuring device 1) as an embodiment includes a light emitting unit (light emitting unit 2) in which multiple light emitting elements (light emitting elements 2a) including vertical cavity surface emitting lasers are arranged, and a driving unit (driving unit 3 or 3A) that, regarding the light emitting element in the light emitting unit, causes multiple light emitting elements to be caused to emit light in a light emission target period (light emission target period St) to emit light in a time-divided manner in the light emission target period.

By adopting time-division light emission, the number of light emitting elements that are caused to emit light simultaneously is reduced.

Accordingly, it is possible to curb temperature rise.

Additionally, in the light source device as the embodiment, the light emission target period is synchronized with the frame period of the image sensor that receives light emitted from the light emitting unit and reflected by the subject.

This makes it possible for the light emitting element to emit light at an appropriate timing according to the frame cycle of the image sensor in a case where the subject is irradiated with light emitted by the light emitting unit and received by the image sensor for distance measurement.

Accordingly, distance measurement accuracy can be improved. Additionally, it is possible to curb temperature rise in the case where the light source device is used as a light source for measuring the distance of the subject.

Moreover, in the light source device as the embodiment, the driving unit switches between simultaneous light emission driving of causing multiple light emitting elements to emit light simultaneously in the light emission target period and division light emission driving of causing multiple light emitting elements to emit light in a time-divided manner in the light emission target period.

By performing simultaneous light emission, in a case where the subject is irradiated with light emitted by the light emitting unit and received by the image sensor to perform distance measurement, a decrease in distance measurement accuracy for a moving subject is prevented.

Hence, according to the above configuration, it is possible to both prevent a decrease in distance measurement accuracy and curb temperature rise.

Furthermore, in the light source device as the embodiment, the driving unit switches between simultaneous light emission driving and division light emission driving on the basis of the temperature.

This makes it possible to appropriately switch between simultaneous light emission and time-division light emission according to the temperature, such as switching from simultaneous light emission to time-division light emission in a case where the temperature rises to a predetermined value or higher, for example.

Accordingly, it is possible to curb temperature rise while curbing a decrease in distance measurement accuracy.

Additionally, in the light source device as the embodiment, the driving unit sets the same total light emission amount of the light emitting unit for simultaneous light emission driving and division light emission driving.

This prevents difference in the amount of light received by the image sensor between simultaneous light emission driving and division light emission driving in a case where the subject is irradiated with light emitted by the light emitting unit and received by the image sensor for distance measurement.

Accordingly, it is possible to prevent distance measurement accuracy from fluctuating between simultaneous light emission driving and division light emission driving.

Moreover, in the light source device as the embodiment, the driving unit varies the number of light emitting elements that are caused to emit light simultaneously in the time direction during time-division light emission.

Since the mode of temperature rise changes depending on the number of light emitting elements that are caused to emit light simultaneously, according to the above configuration, it is possible to control the mode of temperature change in the time direction when time-division light emission is performed. Specifically, it is possible to control the mode of temperature change in the time direction so as to curb the temperature peak value in the light emission target period.

Accordingly, the effect of curbing temperature rise can be enhanced.

Furthermore, in the light source device as the embodiment, the driving unit reduces the number of light emitting elements that are caused to emit light simultaneously in the time direction during time-division light emission.

When time-division light emission is performed, there is a possibility that the later the light emission order, the higher the ambient temperature has risen. For this reason, by reducing the number of light emitting elements that are caused to emit light simultaneously in the time direction, the number of light emitting elements that are caused to emit light in a later order is reduced from the number of light emitting elements that are caused to emit light in an earlier order.

As a result, it is possible to curb the temperature peak value in the light emission target period, and enhance the effect of curbing temperature rise.

Additionally, in the light source device as the embodiment, the driving unit varies the number of simultaneous light emission groups, which are groups of light emitting elements that are caused to emit light simultaneously in time-division light emission, according to the temperature.

Increasing the number of simultaneous light emission groups leads to a decrease in the number of light emitting elements that are caused to emit light simultaneously, whereby the effect of curbing temperature rise is enhanced. On the other hand, increasing the number of simultaneous light emission groups leads to a decrease in distance measurement accuracy when the subject is moving. By varying the number of simultaneous light emission groups according to the temperature as described above, it is possible to achieve time-division light emission with an appropriate number of simultaneous light emission groups, such as increasing the number of simultaneous light emission groups when the temperature is high, and decreasing the number of simultaneous light emission groups when the temperature is low, for example.

Accordingly, it is possible to enhance the effect of curbing temperature rise while curbing a decrease in distance measurement accuracy.

Moreover, in the light source device as the embodiment, the driving unit increases the number of simultaneous light emission groups as the temperature rises.

As a result, it is possible to perform light emission driving with a higher effect of curbing temperature rise as the temperature rises.

Accordingly, it is possible to provide a light source device in which problems due to temperature rise are less likely to occur.

Furthermore, in the light source device as the embodiment, the driving unit drives the light emitting elements so that adjacent light emitting regions in the light emitting unit are not caused to emit light consecutively during time-division light emission.

Since the temperature rise is increased when adjacent light emitting regions are caused to emit light consecutively, the light emitting elements are driven so that adjacent light emitting regions are not caused to emit light consecutively as described above.

Accordingly, the effect of curbing temperature rise can be enhanced.

Additionally, in the light source device as the embodiment, the driving unit drives the light emitting elements so that the inner light emitting region is caused to emit light after the outer light emitting region in the light emitting unit during time-division light emission.

Since the light emitting unit tends to accumulate heat in the central portion, there is a possibility that the temperature rise may be increased if the light emission is started from the inner light emitting region. For this reason, as described above, the light emitting elements are driven so that the inner light emitting region is caused to emit light after the outer light emitting region.

Accordingly, the effect of curbing temperature rise can be enhanced.

Additionally, a drive method as an embodiment is a drive method including, regarding a light emitting element (light emitting element $2a$) in a light emitting unit (light emitting unit 2) in which multiple light emitting elements including vertical cavity surface emitting lasers are arranged, causing multiple light emitting elements to be caused to emit light in a light emission target period to emit light in a time-divided manner in the light emission target period.

Moreover, a sensing module as an embodiment includes the light source device as the above embodiment, and an image sensor (image sensor 7) that receives and captures light emitted from a light emitting unit (light emitting unit 2) included in the light source device and reflected by a subject (see configuration shown in FIGS. 8A and 8B, for example).

An operation and effect similar to those of the light source device as the above-described embodiment can be obtained by such a drive method and sensing module as embodiments.

Note that in the above, the switch SW is provided for each light emitting element $2a$ to enable individual driving for each light emitting element $2a$. However, in the present technology, individual driving for each light emitting element $2a$ is not essential, and it is sufficient that individual driving is enabled at least for each simultaneous light emission group. Additionally, although the present technology has been applied to a distance measuring device in the above example, the present technology is not limited to application to a light source for distance measuring.

Note that the effect described in the present specification is merely an example and is not limited, and other effects can be obtained.

<8. Present Technology>

Note that the present technology can also be configured in the following manner.

(1)

A light source device including:

a light emitting unit in which multiple light emitting elements including vertical cavity surface emitting lasers are arranged; and a driving unit that, regarding the light emitting element in the light emitting unit, causes multiple light emitting elements to be caused to emit light in a light emission target period to emit light in a time-divided manner in the light emission target period.

(2)

The light source device according to (1) above, in which the light emission target period is synchronized with a frame period of an image sensor that receives light emitted from the light emitting unit and reflected by a subject.

(3)

The light source device according to (1) or (2) above, in which the driving unit switches between simultaneous light emission driving of causing the multiple light emitting elements to emit light simultaneously in the light emission target period and division light emission driving of causing the multiple light emitting elements to emit light in a time-divided manner in the light emission target period.

(4)

The light source device according to (3) above, in which the driving unit switches between the simultaneous light emission driving and the division light emission driving on the basis of a temperature.

(5)

The light source device according to (3) or (4) above, in which the driving unit sets a same total light emission amount of the light emitting unit for the simultaneous light emission driving and the division light emission driving.

(6)

The light source device according to any one of (1) to (5) above, in which the driving unit varies the number of the light emitting elements that are caused to emit light simultaneously in a time direction during the time-division light emission.

(7)

The light source device according to (6) above, in which the driving unit reduces the number of the light emitting elements that are caused to emit light simultaneously in the time direction during the time-division light emission.

(8)

The light source device according to any one of (1) to (7) above, in which the driving unit varies the number of simultaneous light emission groups, which are groups of the light emitting elements that are caused to emit light simultaneously during the time-division light emission, according to the temperature.

(9)

The light source device according to (8) above, in which the driving unit increases the number of the simultaneous light emission groups as the temperature rises.

(10)

The light source device according to any one of (1) to (9) above, in which the driving unit drives the light emitting elements so that adjacent light emitting regions in the light emitting unit are not caused to emit light consecutively during the time-division light emission.

(11)

The light source device according to any one of (1) to (10) above, in which the driving unit drives the light emitting elements so that an inner light emitting region is caused to emit light after an outer light emitting region in the light emitting unit during the time-division light emission.

REFERENCE SIGNS LIST

1 Distance measuring device
2 Light emitting unit
2a Light emitting element
3, 3A Driving unit
7 Image sensor
10 Temperature detection unit
S Subject
B Substrate
Ch2, Ch3, Ch4, Ch34, Ch7 Chip
30, 30A Drive circuit
31 Drive control unit
Q1, Q2 Switching element
SW Switch
St Light emission target period
100, 100A Light source device

The invention claimed is:

1. A light source device, comprising:
a light emitting unit that includes multiple light emitting elements, wherein the multiple light emitting elements include vertical cavity surface emitting lasers; and
a driving unit configured to control the multiple light emitting elements to emit light in a time-divided manner in a light emission target period.

2. The light source device according to claim 1, wherein the light emission target period is synchronized with a frame period of an image sensor that receives the light emitted from the light emitting unit and reflected by a subject.

3. The light source device according to claim 1, wherein the driving unit is further configured to switch between a simultaneous light emission process and a division light emission process,
in the simultaneous light emission process, the driving unit is further configured to control the multiple light emitting elements to simultaneously emit the light in the light emission target period, and
in the division light emission process, the driving unit is further configured to control the multiple light emitting elements to emit the light in the time-divided manner in the light emission target period.

4. The light source device according to claim 3, wherein the driving unit is further configured to switch between the simultaneous light emission process and the division light emission process based on a temperature of the light source device.

5. The light source device according to claim 3, wherein the driving unit is further configured to set a total light emission amount of the light emitting unit to be same for the simultaneous light emission process and the division light emission process driving.

6. The light source device according to claim 1, wherein
the driving unit is further configured to vary a count of a set of light emitting elements of the multiple light emitting elements, and
the set of light emitting elements is configured to simultaneously emit the light in a time direction during a time-division light emission process.

7. The light source device according to claim 6, wherein the driving unit is further configured to reduce the count of the set of light emitting elements.

8. The light source device according to claim 1, wherein a set of light emitting elements of the multiple light emitting units corresponds to a number of simultaneous light emission groups, which are groups of the set of light emitting elements configured to emit the light simultaneously during a time-division light emission process, based on a temperature of the light source device.

9. The light source device according to claim 8, wherein the driving unit is further configured to increase the number of the simultaneous light emission groups based on increase in the temperature.

10. The light source device according to claim 1, wherein the light emitting unit comprises a plurality of light emitting regions, and
the driving unit is further configured to drive the multiple light emitting elements to control adjacent light emitting regions of the plurality of light emitting regions to not consecutively emit the light during a time-division light emission process.

11. The light source device according to claim 1, wherein
the light emitting unit comprises an inner light emitting region and an outer light emitting region, and
the driving unit is further configured drive the multiple light emitting elements to control the inner light emitting region to emit the light after outer light emitting region during a time-division light emission process.

12. A drive method, comprising:
in a light source device that includes a light emitting unit and a driving unit, wherein the light emitting unit comprises multiple light emitting elements that include vertical cavity surface emitting lasers:
controlling, by the driving unit, the multiple light emitting elements to emit light in a time-divided manner in a light emission target period.

13. A sensing module, comprising:
a light source device that comprises:
a light emitting unit that includes multiple light emitting elements, wherein the multiple light emitting elements include vertical cavity surface emitting lasers; and
a driving unit configured to control the multiple light emitting elements to emit light in a time-divided manner in a light emission target period; and
an image sensor configured to receive and capture the light emitted from the light emitting unit and reflected by a subject.

\* \* \* \* \*